(12) United States Patent
Kunitake et al.

(10) Patent No.: US 7,407,895 B2
(45) Date of Patent: Aug. 5, 2008

(54) PROCESS FOR PRODUCING DIELECTRIC INSULATING THIN FILM, AND DIELECTRIC INSULATING MATERIAL

(75) Inventors: Toyoki Kunitake, Wako (JP); Yoshitaka Aoki, Wako (JP)

(73) Assignee: Riken, Saitama (JP)

( * ) Notice: Subject to any disclaimer, the term of this patent is extended or adjusted under 35 U.S.C. 154(b) by 8 days.

(21) Appl. No.: 10/550,016

(22) PCT Filed: Mar. 26, 2004

(86) PCT No.: PCT/JP2004/004312

§ 371 (c)(1),
(2), (4) Date: Jul. 24, 2006

(87) PCT Pub. No.: WO2004/086486

PCT Pub. Date: Oct. 7, 2004

(65) Prior Publication Data

US 2006/0261516 A1    Nov. 23, 2006

(30) Foreign Application Priority Data

Mar. 26, 2003   (JP)  ............................. 2003-085193

(51) Int. Cl.
*H01L 21/00* (2006.01)
(52) U.S. Cl. ................. 438/785; 438/758; 257/E21.271
(58) Field of Classification Search ............... 438/762, 438/785, 758, 761, 765, 773
See application file for complete search history.

(56) References Cited

U.S. PATENT DOCUMENTS

2002/0190251 A1 * 12/2002 Kunitake et al. .............. 257/43

FOREIGN PATENT DOCUMENTS

| JP | 10-249985 A | 9/1998 |
| JP | 2002-338211 A | 11/2002 |
| WO | WO-02/31875 A2 | 4/2002 |

* cited by examiner

*Primary Examiner*—Michael S. Lebentritt
*Assistant Examiner*—Reema Patel
(74) *Attorney, Agent, or Firm*—Birch, Stewart, Kolasch & Birch, LLP

(57) ABSTRACT

Provided is a method for producing, in a simple manner, a general-purpose dielectric insulating thin film that has a varying dielectric constant and accepts an accurate film thickness control and a control of the composition, the structure and the thickness thereof. The process includes a step (A) of making a substrate having a hydroxyl group in its surface or having a hydroxyl group introduced into its surface, adsorb a metal compound having a functional group capable of reacting with a hydroxyl group for condensation and capable of forming a hydroxyl group through hydrolysis, a step (B) of removing the excessive metal compound from the substrate surface, a step (C) of hydrolyzing the metal compound to form a metal oxide layer, and a step (D) of treating the metal oxide layer according to any one treating method selected from the group consisting of oxygen plasma treatment, ozone oxidation treatment, firing treatment and rapid thermal annealing treatment to thereby obtain a dielectric insulating thin film.

2 Claims, 11 Drawing Sheets

(1A-1)

(1A-2)

(1B-1)

(1B-2)

(1C-1)

(1C-2)

(2A-1)

(2A-2)

(2B-1)

(2B-2)

(3A-1)

(3A-2)

(3B-1)

(3B-2)

(METHOD A-1)

(METHOD A-2)

(METHOD B-1)

(METHOD B-2)

PROCESS FOR PRODUCING DIELECTRIC INSULATING THIN FILM, AND DIELECTRIC INSULATING MATERIAL

This National Phase PCT application claims priority under 35 U.S.C. § 119(a) on patent application Ser. No. 2003-085193 filed in Japan on Mar. 26, 2003, the entire contents of which are hereby incorporated by reference.

TECHNICAL FIELD

The present invention relates to a process for producing a dielectric insulating thin film and a dielectric insulating material that are novel. More precisely, the invention relates to a process for producing a dielectric insulating thin film, in which the composition, the structure and the thickness of the thin film produced can be under nano-level control and which can surely produce a dielectric insulating thin film having a varying dielectric constant with good thickness accuracy; and relates to a dielectric insulating material having a desired relative dielectric constant.

BACKGROUND ART

Fabrication of metal oxide ultra-thin films having a nano-scale film thickness and having a good insulating property and a good dielectric property is actively studied in various fields from their broad applicability and from the industrial demand for them. For example, in the current semiconductor industry, it is an important technical theme to further increase the degree of integration of one layer in large-scale integrated circuits. For this, it is necessary and indispensable to make an insulating capacitor, one constitutive element of a circuit, of nanometer-level thin films. In recent ultra-micropatterned CMOS devices, some device parameters are now being to their practicable limit. Accordingly, development of ultra-thin film materials of high-dielectric-constant oxides capable of being substitutable for silicon oxide gate-insulating films in MOS transistors, low-dielectric-constant insulating film materials capable of being introduced into the space of multi-level Cu wiring structures, and processes for producing them could be an important breakthrough to the high-speed, power-saving and high-integration devices that are coming in future.

In the field of optoelectronics expected for its industrialization in the coming days, a coating technique with a dielectric thin film material of metal oxide having good reflection efficiency is desired and studied, and also in this, it is an important technical theme to develop a nano-level, accurate and uniform thin film material of metal oxide having a relatively high dielectric constant and a process for producing it.

Further, as a microwave modulation element in high-speed communication devices such as mobile phones and radio-LAN-related devices, a metal oxide capacitor having a varying dielectric constant is used, and the capacitance of the capacitor itself has a significant influence on its properties. Specifically, also in this field, there may be a greatly increasing demand for metal oxide thin films that are thinner and have a higher dielectric constant.

Accordingly, since the application fields of dielectric thins films of metal oxides extend extremely broadly, the level of the dielectric constant thereof required varies depending on their application fields, and the value may range from 1.5 to 100 or more. Therefore, the necessary condition common to the process of producing such dielectric thin films of metal oxides is that a nano-level thin and dense film of a metal oxide having a good insulating property is produced with good thickness accuracy and, at the same time, the oxide thin film is produced under nano-level control of its composition and structure for the purpose of designing the dielectric property of the film in any desired range in accordance with the object thereof. In addition, it is desirable that the process is inexpensive and energy-saving, not producing a large environmental load.

Heretofore, a method mentioned below is known for producing an ultra-thin film of metal oxide. For example, it is known that, in a method of growing a thin film from a vapor phase, such as CVD or PVD, a thin film having a thickness in an order of a few μm can be relatively readily produced (G. D. Wilk, et al., J. Appl. Phys., 89, p. 5243 (2001)). However, when a thin film having a nanometer-range thickness is desired to be produced according to the method, then the economical load to the apparatus itself for the production may be large and there may occur various problems in point of the material cost, the energy consumption and the exhaust gas treatment. Accordingly, it could not always be said that the producibility in the production method as a whole may be good. In addition, the method is not always suitable for producing a thin and uniform film on a substrate having a complicated form or on a substrate having a large area. Further, in the film production method, in general, the substrate temperature must be kept at a high temperature, and therefore the method is further problematic in that the metal oxide/substrate interface reaction may form some interfacial phase and it may worsen the dielectric property of the ultra-thin film of oxide produced.

Recently, a novel thin film production method referred to as ALD has been proposed, in which vapor phase growth and surface reaction are combined. For example, when two types of reactive gases such as titanium tetrachloride and hydrogen peroxide are alternatively introduced into a reactor, then an oxide thin film having an atomic-level thickness can be formed one after another. In such an ultra-thin film production process combined with surface reaction, a uniform thin film can be formed on a substrate of any and every form, in principle (M. Ritala, et al., Science, 288, p. 319 (2000)). However, so far as a vapor-phase method is employed, it is difficult to dramatically improve the energy efficiency and the material balance in the production process. In addition, since the raw materials usable in the process are limited, it is extremely difficult to design the composition and the structure of the metal oxide thin films to be produced, in any desired manner in accordance with a broad application range of the produced films, and to control the electric properties of the produced films.

A sol-gel process is often used in a method of producing metal oxide thin films. The method comprises optionally adding water and an organic solvent to a metal alkoxide, and applying the resulting solution onto a substrate in mode of dipping or spin coating to thereby form a thin film having a thickness of a few μm. In this case, however, since the thickness of the gel coating film is determined depending on the hydrodynamic physical data of the sol such as the viscosity and the density thereof, it is extremely difficult to form a uniform thin film having a thickness of 0.1 μm or less. In addition, it is also difficult to uniformly control the film composition and, as a result, the mechanical strength of the film obtained is extremely low and this causes the reduction in the breakdown voltage of the film. This problem is a fatal defect in practical use of dielectric materials, and in fact, there is no example of using the ultra-thin film of metal oxide produced according to the method for an insulator capacitor material. The same problem is pointed out also in a coating and drying method of using a metal oxide colloid.

Further, a method of producing a metal oxide thin film from deposition of a supersaturated solution of an inorganic ion, and a method of producing an oxide thin film on the surface of an electrode in an electrochemical process are studied (T. P. Niesen, *J. Electroceram.*, 6, p. 169 (2001)). In these methods, a particulate or rod-like structure is formed on a solid surface, and a metal oxide thin film having a uniform nano-level thickness could not be obtained.

On the other hand, a surface sol-gel reaction method is known as a type of a wet process, which comprises contacting an excess amount of a metal compound having a group capable of reacting with a hydroxyl group for condensation and capable of producing a hydroxyl group through hydrolysis, with a solid having a surface hydroxyl group in a mode of chemical adsorption, then removing the excess metal compound from the solid surface, and thereafter hydrolyzing the metal compound existing on the solid surface to thereby form a deposition of an ultra-thin layer of a metal oxide gel thereon (JP-A 9-241008). In this method, since the thickness of the oxide thin film to be formed is defined by the adsorption saturation of the metal compound on the solid surface, or that is, by the amount of the hydroxyl group existing in the solid surface, an ultra-thin film of metal oxide gel having a predetermined thickness can be formed and, when the operation is repeated, then the metal oxide gel film can be formed with good thickness accuracy one after another. However, since the oxide gel thin film obtained according to the above-mentioned method has a low density and since it has a remaining organic functional group, and the film is problematic in that it readily undergoes dielectric breakdown. Accordingly, the ultra-thin film of metal oxide gel obtained according to the method could not be directly used for a dielectric insulating film material.

When the problems with the above-mentioned prior-art production methods and dielectric insulating materials are taken into consideration, then the matter of importance in a novel method for producing a dielectric insulating thin film is that a dielectric insulating thin film is produced with nano-level accuracy and with good producibility from a general and inexpensive metal oxide precursor by the use of a simple production apparatus and that the method itself may accept the control of the composition, the structure and the thickness of the thin film produced therein in order that the film produced can satisfy the requirement for the properties of various dielectric insulating thin films in any desired manner. Further, it is also important that the novel dielectric insulating material comprises the above-mentioned metal oxide thin film and has a desired dielectric constant.

Given that situation, the present invention has been made in consideration of the above-mentioned various problems, and an object of the invention is to provide a method for producing a dielectric insulating thin film, which is simple in its operation and which may produce a general-purpose dielectric insulating thin film having a varying dielectric constant and accepting an accurate film thickness control and a control of the composition, the structure and the thickness of the film produced. Another object of the invention is to provide a dielectric insulating thin film having a desired relative dielectric constant and a desired leakage current characteristic, and to provide a dielectric insulating material containing the dielectric insulating thin film.

DISCLOSURE OF THE INVENTION

We, the present inventors have assiduously studied for the purpose of solving the above-mentioned problems, and, as a result, have found that, when a metal oxide gel ultra-thin film formed through sol-gel reaction is treated under a predetermined condition, then a dielectric insulating thin film of a metal oxide having a nano-level uniform thickness can be obtained. Further, we have found that, when the type of the metal of the metal oxide to be used in the process of successive formation of the above-mentioned metal oxide thin film is varied, or when an organic compound is used in place of the metal oxide to form an organic compound layer, then dielectric insulating thin films differing in their composition, structure and thickness can be produced, and have completed the present invention.

Specifically, the object of the invention is attained by a method for producing a dielectric insulating thin film mentioned below.

(1) A method for producing a dielectric insulating thin film, comprising a step (A) of making a substrate having a hydroxyl group in its surface or having a hydroxyl group introduced into its surface, adsorb a metal compound having a functional group capable of reacting with a hydroxyl group for condensation and capable of forming a hydroxyl group through hydrolysis, a step (B) of removing the excessive metal compound from the substrate surface, a step (C) of hydrolyzing the metal compound to thereby form a metal oxide layer having a hydroxyl group in the surface thereof, and a step (D) of treating the above-mentioned layer according to any one treating method selected from the group consisting of oxygen plasma treatment, ozone oxidation treatment, firing treatment and rapid thermal annealing treatment to thereby obtain a dielectric insulating thin film.

(2) The production method of (1), wherein the metal compound is a transition metal compound or a rare earth metal compound.

(3) The production method of (1) or (2), which further comprises, between the step (C) and the step (D), a step (E) of making the metal oxide layer formed in the step (C) adsorb an organic compound capable of forming a functional group that may be adsorbed by a metal compound, and a step (F) of removing the excessive organic compound from the surface of the metal oxide layer to thereby form an organic compound layer.

(4) The production method of (1) or (2), which further comprises, between the step (C) and the step (D), a step (G) of making the hydroxyl group in the surface of the metal oxide layer formed in the step (C), adsorb a rare earth metal ion, and a step (H) of removing the excessive rare earth metal ion from the surface of the metal oxide layer and hydroxylating the adsorbed rare earth metal ion to thereby form a rare earth metal layer.

(5) The production method of (3), wherein the steps (A) to (C) and/or the steps (E) and (F) are repeated at least once between the step (C) and the step (D) to thereby laminate at least two layers of metal oxide layer and/or organic-inorganic hybrid layer.

(6) The production method of (4), wherein the steps (A) to (C) as well as the steps (G) and (H) are repeated at least once between the step (C) and the step (D) to thereby form at least two layers of metal oxide layer and/or rare earth metal layer.

(7) The production method of (5) or (6), wherein at least two layers of metal oxide layer, organic-inorganic hybrid layer and/or rare earth metal layer formed contain different types of metal compounds, organic compounds and/or rare earth metals.

The other object of the invention is attained by a dielectric insulating thin film and a dielectric insulating material mentioned below.

(1) A dielectric insulating thin film obtained according to the production method of any of above (1) to (7).

(2) A dielectric insulating material comprising a dielectric insulating thin film that has at least two metal oxide layers of different types of metal oxides, wherein the dielectric insulating thin film has a relative dielectric constant of from 1 to 40, and has a leakage current density of from $10^{-12}$ to $10^{-3}$ A $cm^{-2}$ when an electric field of 1 MV $cm^{-1}$ is applied thereto, and it has a thickness of from 10 to 50 nm.

(3) The dielectric insulating material of (2), wherein the metal oxide is at least two selected from the group consisting of titanium oxide, tantalum oxide, zirconium oxide, lanthanum oxide, silicon oxide and hafnium oxide.

(4) A dielectric insulating material having a dielectric insulating thin film that comprises at least one layer of transition metal oxide layer as well as rare earth metal layer and/or rare earth metal oxide layer, wherein the dielectric insulating thin film has a relative dielectric constant of from 1 to 100.

(5) The dielectric insulating material of (4), wherein the dielectric insulating thin film has a leakage current density of from $10^{-12}$ to $10^{-3}$ A $cm^{-2}$ when an electric field of 1 MV $cm^{-1}$ is applied thereto.

(6) The dielectric insulating material of (4) or (5), wherein the dielectric insulating thin film has a thickness of from 1 nm to 1 μm.

(7) A dielectric insulating material having a dielectric insulating thin film that comprises at least one layer of metal oxide layer and organic compound layer.

(8) The dielectric insulating material of (7), wherein the organic compound contained in the organic compound layer is polydiallyldimethylammonium hydrochloride.

(9) The dielectric insulating material of (7) or (8), wherein the metal compound contained in the metal oxide layer contains an Si element.

(10) The dielectric insulating material of any of (7) to (9), wherein the dielectric insulating thin film has a relative dielectric constant of from 1 to 100.

(11) The dielectric insulating material of any of (7) to (10), wherein the dielectric insulating thin film has a leakage current density of from $10^{-12}$ to $10^{-3}$ A $cm^{-2}$ when an electric field of 1 MV $cm^{-1}$ is applied thereto.

(12) The dielectric insulating material of any of (7) to (11), wherein the dielectric insulating thin film has a thickness of from 1 nm to 10 μm.

The production method of the invention can produce a nanometer-level and uniform metal oxide dielectric insulating thin film on a substrate having any and every form or on a substrate having a large area, under a mild condition and in a simple manner. In addition, according to the production method of the invention, a metal layer, a metal oxide layer and an organic-inorganic nanohybrid layer having a variety of laminate structures and compositions can be designed, and therefore the production method can produce a dielectric insulating thin film having a varying dielectric constant. Further, the dielectric insulating thin film produced in the method has an extremely excellent insulating property, and though it has a thickness of tens nanometers or so, it well functions as a dielectric insulating film material.

The production method and the dielectric insulating material of the invention, which have such excellent characteristics not seen in any others, are expected to be applied in various fields as an important basic technique for high-integration devices of the next generation, as a coating technique for various dielectric films for general-purpose products, and as a method for producing a thin film having some novel opto-electronic characteristics.

BEST MODE FOR CARRYING OUT THE INVENTION

Figure 1:
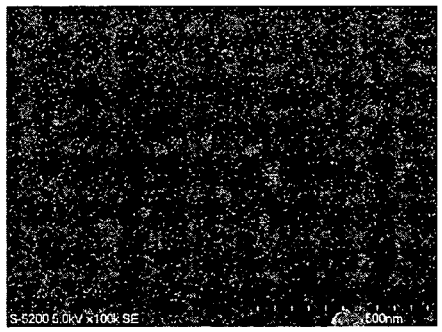
FIG. 1 shows scanning electromicroscopic photographs of the surface of a titanium oxide dielectric ultra-thin film of the invention (1A-1) and the cross section thereof (1A-2); the surface of a zirconium dielectric ultra-thin film of the invention (1B-1) and the cross section thereof (1B-2); and the surface of a tantalum oxide dielectric ultra-thin film of the invention (1C-1) and the cross section thereof (1C-2). In 1A-1, 1B-1 and 1C-1, one division of the scale is 50 nm; and in 1A-2, 1B-2 and 1C-2, it is 20 nm.
Figure 1:
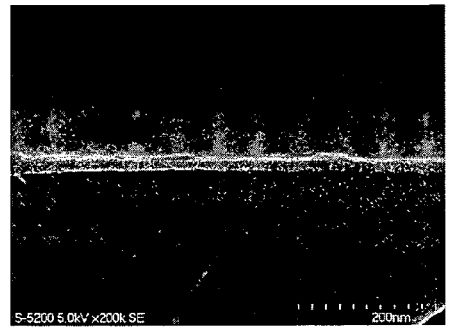
Figure 1:
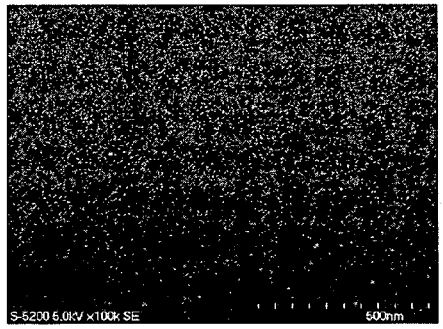
Figure 1:
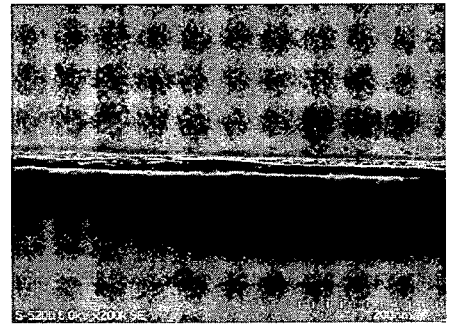
Figure 1:
Figure 1:
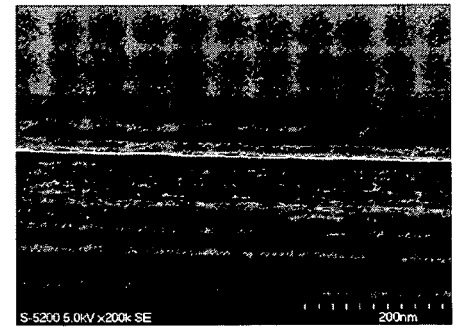

Embodiments of the invention are described in detail hereinunder in point of the materials and the process steps employed in the invention.

In this description, the numerical range expressed by the wording "a number to another number" means the range that falls between the former number indicating the lowermost limit of the range and the latter number indicating the uppermost limit thereof.

[Method for Producing Dielectric Insulating Material of the Invention]

In the production method of the invention, the substrate on which a metal oxide thin film is to be formed may be any one having a hydroxyl group in its surface or capable of being processed for introducing a hydroxyl group thereinto, and is not specifically defined. For example, when the practicability thereof for insulating films and capacitor films is taken into consideration, then the substrate is preferably glass, transparent electrodes of ITO or ZnO, silicon wafers readily oxidized on the surface thereof and substrates of aluminium or copper, having a hydroxyl group in the surface thereof. More preferred is a substrate that contains an Si element, having good adsorbability of a metal oxide layer.

In the production method of the invention, when the substrate does not have a hydroxyl group in its surface, for example, when the substrate is that of cadmium sulfide, polyaniline or gold, then a hydroxyl group may be introduced into the surface of the substrate and the resulting substrate may be used in the invention. For introducing a hydroxyl group into the substrate surface, employable is any known method for hydroxyl group introduction. For example, mercapto-ethanol may be adsorbed by the surface of metal whereby a hydroxyl group may be introduced into the surface.

The amount per unit area of the hydroxyl group that exists in the substrate surface or that is introduced thereinto has an influence on the density of the metal compound thin film to be formed. For example, when an insulating thin film having a good insulating property is formed, then the amount of the hydroxyl group is suitably from $5.0 \times 10^{13}$ to $5.0 \times 10^{15}$ equivalent/cm$^2$, more preferably from $1.0 \times 10^{14}$ to $2.0 \times 10^{14}$ equivalent/cm$^2$.

The size and the form of the substrate to be used in the production method of the invention are not specifically defined. In the production method of the invention, the substrate surface adsorbs a metal compound and therefore the substrate is not always required to have a smooth surface. In the invention, the substrate may be suitably selected from those of various materials and various forms. For example, regarding its form, the substrate may have any form of fibers, beads, powders or flakes. In addition, the substrate may have a lot of attitude in its size, including inner surfaces of filters and porous substances and even large-area walls, etc.

The steps (A) to (H) of the production method of the invention are described below.

Not specifically defined, the metal compound to be used in the step (A) may be any one having a functional group capable of reacting with a hydroxyl group for condensation and capable of forming a hydroxyl group through hydrolysis.

Typical examples of the metal compound used in the step (A) are metal alkoxides such as titanium butoxide (Ti(O-nBu)$_4$), zirconium propoxide (Zr(O-nPr)$_4$), aluminium butoxide (Al(O-nBu)$_4$), niobium butoxide (Nb(O-nBu)$_5$) silicon tetramethoxide (Si(O-Me)$_4$), boron ethoxide (B(O-Et)$_3$), hafnium tetrabutoxide (Hf(O-nBu)$_4$); metal alkoxides having two or more alkoxyl groups such as methyltrimethoxysilane (MeSi(OMe)$_3$), diethyldiethoxysilane (Et$_2$Si(O-Et)$_2$); metal alkoxides having a ligand such as acetylacetone and having two or more alkoxyl groups; metal alkoxides with a rare earth metal such as lanthanide isopropoxide (Ln(O-iPr)$_3$), yttrium isopropoxide (Y(O-iPr)$_3$); double-alkoxide compounds such as BaTi(OR)$_x$.

Apart from the above-mentioned metal alkoxides, also usable in the invention are fine particles of alkoxide sol or alkoxide gel obtained through partial hydrolysis and condensation of the metal alkoxide as above with a small amount of water; binuclear or cluster-type alkoxide compounds having plural or multiple types of metal elements, such as titanium butoxide tetramer (C$_4$H$_9$O[Ti (OC$_4$H$_9$)$_2$O]$_4$C$_4$H$_9$) polymers based on a metal alkoxide compound that is mono-dimensionally crosslinked via an oxygen atom.

In the invention, metal complexes capable of being adsorbed by the hydroxyl group in the substrate surface and capable of forming a hydroxyl group in the surface through hydrolysis are also within the scope of the metal compound of the invention. The metal complexes are concretely metal halides such as cobalt chloride (COCl$_2$); metal carbonyl compounds such as titanium oxoacetylacetonate (TiO (CH$_3$COCH$_2$COO))$_2$), pentacarbonyl iron (Fe(CO)$_5$); and their polynuclear clusters.

If desired, the step (A), two or more different types of metal compounds may be combined and used. Combining such different types of metal compounds may form a thin film of a composite metal compound on the substrate surface.

In the step (A) of the production method of the invention, the metal compound is adsorbed by the substrate surface. "Adsorption" as referred to herein is meant to indicate a bonding mode of a chemical bond (e.g., covalent bond, coordinate bond) or an electrostatic bond (e.g., ionic bond) formed between the hydroxyl group in the substrate surface and a metal compound or an organic compound.

Not specifically defined, the method of adsorption in the step (A) may be any one for making a metal compound adsorbed by the surface of a substrate to a saturated adsorption level. In general, herein preferred is a method of applying a metal compound to the surface of a substrate by dissolving a metal compound in an organic solvent followed by dipping a substrate in the resulting solution or applying the solution to a substrate in a mode of spin-coating. The solvent is not specifically defined. For metal alkoxides, for example, the solvent may be generally any of methanol, ethanol, propanol, toluene, carbon tetrachloride or benzene, singly or as combined.

Not specifically defined, the concentration of the metal compound in the solution may be any one that attains adsorption of the compound by the substrate surface. Preferably, it may be from 10 to 100 mmol/liter.

The adsorption time and the adsorption temperature may be suitably defined depending on the adsorption activity of the metal compound used. For example, the adsorption may be attained for a period of from 1 to 20 minutes, preferably from 1 to 10 minutes and at a temperature of from 10 to 80° C., preferably from room temperature to 50° C.

For the adsorption in the step (A), the necessary time may be greatly shortened when a catalyst such as acid or base is used.

As a result of the above-mentioned operation, both a saturated adsorption of a metal compound strongly adsorbed (in a mode of chemical adsorption) by the hydroxyl group in the substrate surface, and an excessive metal compound weakly adsorbed by the substrate surface in a mode of physical adsorption exist on the substrate surface. The excessive metal compound is removed from the substrate surface in the next step (B).

The step (B) of the production method of the invention is described.

In the step (B), the excessive metal compound existing in the substrate surface in the above-mentioned step (A) may be removed. In the production method of the invention, the excessive metal compound is removed in the step (B) and a thin film of the metal compound adsorbed by the substrate surface is formed. In this, therefore, the metal compound thin film may be formed with extremely high accuracy and with high reproducibility in accordance with the amount of the metal compound existing on the substrate surface.

For washing the coated substrate, preferably employed is a method of dipping it in an organic solvent, or a method of spraying an organic solvent on it, or a method of washing it with steam. Preferably, the washing temperature is the same as that in the previous adsorption treatment.

The step (C) of the production method of the invention is described.

After the step (B), the step (C) of the production method of the invention is for hydrolyzing the metal compound adsorbed by the substrate surface to thereby from a metal oxide layer. Hydrolysis of the metal compound results in self-condensation of the metal compound to form a thin layer of a metal oxide. The hydrolysis may be effected in any known method. For example, a most general method for it comprises dipping the substrate having adsorbed a metal compound in water. More preferably, ion-exchanged water is used in this method, as it may prevent the system from being contaminated with impurities and a metal oxide of high purity can be formed. During the hydrolysis, a catalyst such as acid or base may be used to greatly shorten the necessary time for the hydrolysis.

When the metal compound adsorbed by the substrate surface has high reactivity with water, then it may be hydrolyzed with water vapor in air.

After the hydrolysis of the metal compound, the substrate surface may be dried, if desired, with a drying gas such as nitrogen gas, and a metal oxide layer is thereby formed.

The steps (E) and (F) of the production method of the invention are described.

In the production method of the invention, an organic compound layer may be further formed on the metal oxide layer formed in the previous step (C) to thereby give an organic-inorganic hybrid layer (steps E and F).

Not specifically defined, the organic compound used in the step (E) may be any one capable of forming a functional group that may adsorb a metal compound. From the viewpoint of forming firmer adsorption, it is desirable that the compound has plural functional groups and is solid at room temperature (25° C.). The organic compound of the type includes, for example, polymer compounds having a hydroxyl group or a carboxyl group, such as polyacrylic acid, polyvinyl alcohol, polymethacrylic acid, polyglutamic acid; polysaccharides such as starch, glycogen; disaccharides and monosaccharides such as glucose, mannose; and ammonium salts such as polydiallyldimethylammonium hydrochloride. Of those, preferred for use herein is polydiallyldimethylammonium hydrochloride (PDDA). PDDA is extremely stable in an aqueous solution and in air, and it may form a stable organic compound layer in the step (F).

In the step (E), for making an organic compound adsorbed by the metal oxide layer, employable is the same adsorption method as that for the above-mentioned metal compound. In general, herein preferred is a method of dipping the substrate with a metal oxide layer formed thereon in a solution prepared by dissolving an organic compound in a polar solvent such as water or ethanol. The concentration of the organic compound in the solution may be from 1 to 10 mg/ml or so. The adsorption time and the adsorption temperature for the organic compound may be defined generally within a range of a period of from 5 to 20 minutes and a temperature of from room temperature to 50° C.

In the step (E), the excessive organic compound over that adsorbed by the metal oxide layer may be removed like in the step (B). After the excessive organic compound has been removed from the metal oxide layer, an organic compound layer chemically adsorbed by the surface of the metal oxide layer may be formed with extremely good accuracy and with high reproducibility in accordance with the amount of the organic compound existing on surface of the layer. For removing the organic compound, herein employable is the same removal method as that for the above-mentioned metal compound. Especially preferably, the coated substrate is washed with the solvent used for the organic compound. Preferably, the washing temperature is the same as that in the previous adsorption operation.

According to the production method of the invention, a metal oxide layer or an organic-inorganic hybrid layer may be formed on the substrate surface as so mentioned hereinabove. In this, when a compound capable of forming a hydroxyl group or a functional group that may adsorb a metal compound such as that mentioned above is used as an inorganic compound or an organic compound, then the hydroxyl group or the functional group capable of adsorbing a metal compound may still remain in the surface of the thin layer even after the metal oxide layer or the organic compound layer has been formed.

Accordingly, in the production method of the invention, the steps (A) to (C) and/or the steps (E) and (F) may be repeated at least once by utilizing the hydroxyl group or the functional group capable of adsorbing a metal compound in the surface of the metal oxide layer or in the surface of the organic compound layer, whereby a plurality of metal oxide layers and organic compound layers may be formed on the substrate. According to the production method of the invention, therefore, a multi-layered structure of various types of metal oxide layers or organic-inorganic hybrid layers having a varying thickness may be formed one after another. In particular, when metal oxide layers and organic compound layers are formed alternately one after another, then the resulting organic-inorganic hybrid layer is preferable as having extremely high strength.

In the production method of the invention where the steps (A) to (C) and/or the steps (E) and (F) are repeated, a metal oxide layer or an organic-inorganic hybrid layer having a thickness of from a few nanometers to tens nanometers may be formed with accuracy. When a metal alkoxide having one metal atom such as titanium butoxide is used in forming the metal oxide layer, then thin layers each having a thickness of a few angstroms may be laminated one after another depending on the adsorption condition employed. In this case, the increase in the layer thickness in one cycle corresponds to the adsorption of one molecular layer of the metal alkoxide. On the other hand, when particles of an alkoxide gel are sued, then thin layers having a thickness of 60 nanometers or so may be laminated in every cycle. Still on the other hand, when a polyacrylic acid is used as an organic compound, then a thin layer having a thickness of a few angstroms may be formed depending on the adsorption condition employed.

In the production method of the invention, a metal oxide layer or an organic-inorganic hybrid layer having the above-mentioned thickness accuracy may be suitably formed, depending on the degree of the successive lamination of the organic metal oxide layer and/or the organic compound layer. In this, when the type of the metal compound and that of the organic compound to be used are varied, then a laminate structure of different types of metal oxide thin films or organic-inorganic hybrid thin films may be obtained.

The steps (G) and (H) in the invention are described.

The production method of the invention may additionally comprise, between the step (C) and the step (D), a step (G) of making the hydroxyl group in the surface of the metal oxide layer formed in the step (C), adsorb a rare earth metal ion.

Not specifically defined, the rare earth metal ion to be used in the rare earth metal layer may be any one capable of being adsorbed by the hydroxyl group in the surface of the metal oxide layer (in a mode of ionic bonding) and then capable of forming a hydroxyl group through hydroxylation. Typical examples of such a rare earth metal ion-containing compound are rare earth metal compounds that include rare earth metal nitrates such as lanthanum nitrate ($La(NO_3)_3 \cdot 6H_2O$), yttrium nitrate ($Y(NO_3)_3 \cdot 6H_2O$), gadolinium nitrate ($Gd(NO_3)_3 \cdot 6H_2O$); rare earth metal halides such as lanthanum chloride ($LaCl_3 \cdot 6H_2O$), lanthanum fluoride ($LaF_3 \cdot 6H_2O$), yttrium chloride ($YCl_3 \cdot 6H_2O$), gadolinium chloride ($GdCl_3 \cdot 6H_2O$); rare earth metal acetates such as lanthanum acetate ($La(CH_3COO)_3 \cdot 1.5H_2O$), yttrium acetate ($Y(CH_3COO)_3 \cdot 2H_2O$); as well as rare earth metal alkoxide compounds such as lanthanum isopropoxide ($La(O\text{-}iPr)_3$), yttrium isopropoxide ($Y(O\text{-}iPr)_3$).

The solvent in which the rare earth metal ion is dissolved is not specifically defined, for which herein usable is water or aqueous ammonia either singly or as combined. The concentration of the rare earth metal ion-containing solution is not specifically defined so far as it is enough for adsorption of the ion by the surface of the metal oxide layer. For example, the concentration is preferably from 10 to 100 mmol/liter. The adsorption time and the adsorption temperature may be suitably defined depending on the rare earth metal ion used. For example, the adsorption may be attained for a period of from 1 to 20 minutes, preferably from 1 to 10 minutes and at a temperature of from 10 to 80° C., preferably from room temperature to 50° C.

The production method of the invention further comprises a step (H) of removing the excessive rare earth metal ion from the surface of the metal oxide layer and, at the same time, hydroxylating the adsorbed rare earth metal ion to form a rare earth metal layer. For removing the excessive rare earth metal ion in the step (H), any method capable of selectively removing the excessive rare earth metal ion may be employed with no specific limitation thereon. For example, herein preferred is a method of washing the coated substrate ion-exchanged water.

In the step (H), after the excessive rare earth metal ion has been removed, the rare earth metal ion is hydroxylated to form the intended rare earth metal layer. For the hydroxylation in the step (H), employable is any ordinary hydroxylation method of directly introducing a hydroxyl group into the rare earth metal ion or substituting the already-existing substituent with a hydroxyl group, with no specific limitation thereon. For example, the hydroxylation may be attained by treating the rare earth metal ion adsorbed by the surface of the metal oxide layer with ion-exchanged water or alkali solution.

The step (D) of the production method of the invention is described.

In the step (D), each of the metal oxide layer formed in the previous step (C), the organic compound layer formed in the previous steps (E) and (F), and the rare earth metal layer formed in the previous steps (G) and (H) is further treated according to any one treating method selected from the group consisting of oxygen plasma treatment, ozone oxidation treatment, firing treatment and rapid thermal annealing treatment (RTA treatment) to thereby form a dielectric insulating thin film.

In the step (D), the metal oxide layer, the organic compound layer and/or the rare earth metal layer may be irradiated with a predetermined oxygen plasma. The oxygen plasma treatment may promote the decomposition of the alkoxyl group remaining in the metal oxide thin film and/or the organic compound thin film to form a crosslinked structure of metal (or organic compound)-oxygen-metal (or organic compound).

The time, the pressure, the output power and the temperature of the oxygen plasma treatment in the step (D) may be suitably defined depending on the type and the size of the metal compound, the organic compound or the rare earth metal ion that constitute the metal oxide layer, the organic compound layer or the rare earth metal layer, and on the plasma source. For example, the pressure in the oxygen plasma treatment is suitably from 1.33 to 6.65 Pa (10 to 50 mTorr), preferably from 13.3 to 26.6 Pa (100 to 200 mTorr). The plasma output power in the oxygen plasma treatment is suitably from 5 to 500 W, preferably from 10 to 50 W. The time of the oxygen plasma treatment is suitably from 5 minutes to a few hours, preferably from 5 to 60 minutes. The temperature in the oxygen plasma treatment is low, preferably from −30 to 300° C., more preferably from 0 to 100° C., most preferably room temperature (5 to 40° C.).

The plasma device for use in the oxygen plasma treatment is not specifically defined. For example, herein employable is PE-2000 Plasma Etcher from South Bay Technology, USA.

In the step (D) of the production method of the invention, the metal oxide layer, the organic compound layer and/or the rare earth metal layer may be subjected to any of ozone oxidation treatment, firing treatment or rapid thermal annealing treatment, apart from the above-mentioned oxygen plasma treatment.

The condition of the ozone oxidation treatment may be suitably defined depending on the layer to be treated and the device used. For example, the pressure in the ozone oxidation treatment is suitably from atmospheric pressure to 13.3 Pa (100 mTorr), preferably from 133.3 to 13333.3 Pa (0.1 to 100 Torr). The ozone oxidation treatment time is suitably from a few minutes to a few hours, preferably from 5 to 60 minutes. The treatment temperature is suitably from room temperature to 600° C., preferably from room temperature to 400° C.

The condition in the firing treatment may be any one in ordinary firing treatment. For example, the condition in the firing treatment is preferably as follows: It is effected in an air atmosphere at a temperature of from 100 to 1000° C., preferably from 300 to 500° C., for a period of from 30 seconds to 1 hour, preferably from 1 to 20 minutes. When an easily-oxidizing substrate such as Si wafer is used like in the invention, it is desirable that the firing treatment is effected in a nitrogen atmosphere for protecting the substrate from oxidation. The condition in the firing treatment in nitrogen may be the same as that mentioned above.

The condition in the rapid thermal annealing treatment (RTA) using an IR lamp heat source may be suitably defined depending on the layer to be treated and the device (a combination of vacuum pump, vacuum chamber and IR lamp) used, and it may be any one generally employed in ordinary semiconductor processes. For the treatment atmosphere, herein employable is any of an air atmosphere, a nitrogen atmosphere, a reduced oxygen atmosphere having an oxygen partial pressure of from 6.65 to 26.6 Pa (50 to 200 mTorr), or a reduced nitrogen atmosphere having a nitrogen partial pressure of from 6.65 to 26.6 Pa (50 to 200 mTorr). Regarding the treatment temperature and the treatment time thereof, the rapid thermal annealing treatment may be attained at a temperature of from 100 to 1000° C., preferably from 300° C. go 500° C. for a period of from 30 seconds to 1 hour, preferably from 1 to 20 minutes.

[Dielectric Insulating Thin Film and Dielectric Insulating Material of the Invention]

The dielectric insulating thin film of the invention may be obtained according to the above-mentioned production method of the invention, and it is a thin film that comprises a metal oxide layer, an organic-inorganic hybrid layer and/or a rare earth metal layer formed on a substrate.

The dielectric insulating material of the invention may contain the above-mentioned dielectric insulating thin film of the invention. For example, the dielectric insulating material of the invention comprises a dielectric insulating thin film having at least two metal oxide layers of different types of metal oxides, in which the relative dielectric constant of the dielectric insulating thin film is from 1 to 40, preferably from 15 to 40, more preferably from 20 to 35, the leakage current density thereof, when an electric field of 1 MV $cm^{-1}$ is applied thereto, is at most $10^{-3}$ A $cm^{-2}$, preferably from $10^{-12}$ to $10^{-3}$ A $cm^{-2}$, more preferably from $10^{-12}$ to $10^{-6}$ A $cm^{-2}$, most preferably from $10^{-12}$ to $10^{-7}$ A $cm^{-2}$, and the thickness thereof is from 1 to 50 nm, preferably from 5 to 50 nm, more preferably from 5 to 25 nm.

A conventional, transition metal oxide layer-having structure has a low relative dielectric constant ($\in_r$=about 8.9) and could not have a sufficiently high dielectric constant (see M. Agarwal, *Appl. Phys. Lett.*, 71, p. 891 (1997)). The dielectric insulating material of the invention has a relative dielectric constant of at most 40, a leakage current density when an electric field of 1 MV $cm^{-1}$ is applied thereto, of at most $10^{-3}$ A $cm^{-2}$, and a thickness of at most 50 nm, and therefore, it is applicable to high-k materials for CMOS and DRAM of the next generation.

The dielectric insulating material of the invention may contain various and different types of metal oxides. For it, for example, employable are transition metal compounds that contain an element selected from the periods 3 to 6 of the groups 1A to 5A and the groups 1B to 8B of the Periodic Table, and capable of reacting with the hydroxyl group in the substrate surface for condensation and capable of forming a hydroxyl group through hydrolysis. Above all, preferred are at least two selected from the group consisting of titanium oxide, tantalum oxide, zirconium oxide, lanthanum oxide, silicon oxide and hafnium oxide.

The dielectric insulating material of the invention may have a dielectric insulating thin film that comprises at least one layer of transition metal oxide layer as well as rare earth metal layer and/or rare earth metal oxide layer.

The transition metal oxide, the rare earth metal and the rare earth metal oxide to be used in the transition metal oxide layer, the rare earth metal layer and the rare earth metal oxide layer may be the same as those used in the production method of the invention. In consideration of its applicability to high-k materials for next-generation CMOS and DRAM, the dielectric insulating thin film preferably has a relative dielectric constant of from 1 to 100, more preferably from 10 to 100, even more preferably from 20 to 50. The leakage current density of the dielectric insulating thin film, when an electric field of 1 MV $cm^{-1}$ is applied thereto, is preferably from $10^{-12}$ to $10^{-3}$ A $cm^{-2}$, more preferably from $10^{-12}$ to $10^{-6}$ A $cm^{-2}$, even more preferably from $10^{-12}$ to $10^{-7}$ A $cm^{-2}$. The thickness of the dielectric insulating thin film is preferably from 1 to 1 μm, more preferably from 5 to 50 nm, even more preferably from 5 to 20.

A dielectric oxide thin film obtained in a general wet film-formation method has a large leakage current. For example, the leakage current of an $SrTiO_3$ thin film (200 nm) formed according to a sol-gel process is on a level of $10^{-2}$ order when 0.5 MV $cm^{-1}$ is applied to the film (Y. Gao, *Chem. Mater.*, 14, p. 5006 (2002)). As opposed to this, the dielectric insulating material of the invention has a low leakage current density on a level of at most $10^{-3}$ order, preferably at most $10^{-6}$ order as so mentioned hereinabove.

The dielectric insulating material of the invention may have a dielectric insulating thin film that comprises at least one layer of metal oxide layer and organic compound layer. The metal oxide and the organic compound to be in the metal oxide layer and the organic compound layer may be the same as those mentioned hereinabove for the production method of the invention. Above all, preferred for use herein are Si element-containing metal oxides and polydiallyldimethylammonium hydrochloride.

In consideration of its applicability to low-k insulating materials for multi-level Cu wiring structures in next-generation LSI devices, the dielectric insulating thin film to be in the dielectric insulating material may have a relative dielectric constant of from 1 to 100, preferably from 1 to 10, more preferably from 1 to 3, a leakage current density, when an electric field of 1 MV $cm^{-1}$ is applied thereto, of from $10^{-12}$ to $10^{-2}$ A $cm^{-2}$, preferably from $10^{-12}$ to $10^{-7}$ A $cm^{-2}$, more preferably from $10^{-12}$ to $10^{-9}$ A $cm^{-2}$, and a thickness of from 1 nm to 10 μm, preferably from 10 nm to 1 μm, more preferably from 100 nm to 1 μm.

[Layer Constitution]

The dielectric insulating thin film of the invention is a single-layered thin film or a multi-layered thin film of two or more layers. In the multi-layered structure of two or more layers, the rare earth metal, the rare earth metal oxide, the transition metal compound and the organic compound that constitute the individual layers may be the same one or different ones.

The dielectric insulating material of the invention has at least two layers selected from a metal oxide layer such as transition metal oxide layer and rare earth metal oxide layer, a rare earth metal layer comprising a rare earth metal, and an organic compound layer, and it may contain the same type or different types of metals, metal oxides or organic compounds.

The production method of the invention may produce extremely uniform metal oxide thin film and/or organic-inorganic hybrid thin film in a nanometer range, and is therefore an important basic technique for high-integration devices of the next generation. Concretely, the invention may be utilized as a technique of producing high-accuracy insulating thin films in the field of electronics, and as a technique of producing reflection coating films of high efficiency in the field of optoelectronics, and the invention is expected to be applicable to fabrication of micro-memory chips, etc.

According to the production method of the invention, a metal oxide thin film and/or an organic-inorganic hybrid thin film may be formed on a substrate of any and every shape and on a substrate having a large area, under a mild condition and in a simple manner. Therefore, the production method of the invention has high producibility and is expected to be widely popularized as a coating technique for general-purpose products.

EXAMPLES

The production method for a dielectric insulating thin film of the invention and the dielectric insulating thin film of the invention are descried in more detail hereinunder.

The materials, their amount and proportion, and the details of the treatment and the treatment order in the following Examples may be suitably changed and modified, not overstepping the sprit and the scope of the invention. Accordingly, the scope of the invention should not be limitatively interpreted by the concrete examples shown below.

Example 1

In this Example, a dielectric insulating thin film of a metal oxide was formed on the (100) plane of a boron-doped p-type silicon single crystal having a resistivity of from 0.01 to 0.02 Ωcm.

1. Preparation of Silicon Substrate Surface

The surface of the silicon substrate was ultrasonically washed with a carbon tetrachloride solution for 3 minutes, and then dipped in a piranha solution prepared by mixing sulfuric acid and aqueous hydrogen peroxide in a ratio of 7:3, for 10 minutes to thereby decompose and remove the surface contaminants. This was further washed by dipping in ion-exchanged water for 3 minutes. Thus washed, the silicon substrate was dipped in 1% hydrofluoric acid solution, and then dipped in ion-exchanged water for 10 minutes and well rinsed therein to remove the oxide film. The resulting silicon substrate was ultrasonically dipped in aqueous 30% hydrogen peroxide solution for 1 minute, whereby a hydroxyl group was formed on the substrate surface.

2. Formation of Dielectric Insulating Thin Film of Metal Oxide

Titanium butoxide (Ti(O-nBu)$_4$), zirconium isopropoxide (Zr—O-iPr)$_4$ and tantalum ethoxide (Ta(O-Et)$_5$) were used as a metal compound to produce a dielectric insulating thin film of a metal oxide of titanium oxide (TiO$_2$), zirconium oxide (ZrO$_2$) or tantalum oxide (Ta$_2$O$_5$).

The concentration and the type of the solvent of the metal compound solution are shown in Table 1.

TABLE 1

| Metal Compound | Solvent | Concentration (mmol/dm$^3$) |
|---|---|---|
| Ti(O-nBu)$_4$ | toluene/ethanol = 1/1 mixed solvent | 100 |
| Zr—O-iPr)$_4$ | toluene/ethanol = 1/1 mixed solvent | 70 |
| Ta(O-Et)$_5$ | toluene/ethanol = 1/1 mixed solvent | 50 |

The silicon substrate prepared in the manner as above was dipped in the metal oxide solution as in Table 1 at 30° C. for 3 minutes, and then dipped in ethanol at 30° C. for 1 minute for washing to remove the excessive metal alkoxide molecules. Next, this was dipped in ion-exchanged water at 30° C. for 1 minute for hydrolysis, and finally this was dried with a nitrogen gas jet applied thereto to form a metal oxide gel layer deposited thereon. This deposition treatment was repeated 20 times, and the metal oxide gel layer was formed on the silicon substrate one after another. Thus formed, the metal oxide gel layer laminate was irradiated with oxygen plasma under an oxygen pressure of $1.83 \times 10^4$ Pa (183 mbar) and under an output power condition of 30 W for 40 minutes, and then thermally treated in a nitrogen atmosphere at 400° C. for 15 minutes to thereby form a dielectric insulating thin film of the metal oxide.

3. Observation of the Surface Condition of the Dielectric Insulating Thin Film with Scanning Electronic Microscope and Determination of the Thickness of the Film FIG. 1 shows photographs of the surface and the cross section of the dielectric insulating thin films of various metal oxides obtained herein, taken through a scanning electronic microscope. As in FIG. 1, all the thin films had a uniform thickness, and these were smooth and dense ultra-thin films of metal oxide. From this, it is understood that the dielectric insulating thin films of the invention are excellent dielectric insulating thin films in consideration of the fact that thin films (not shown) obtained in a conventional ordinary wet film-formation method (e.g., sol-gel method, spin-coating method, spraying method) have a rough surface texture since coarse particles formed through condensation of a metal compound in a precursor solution may exist in the thin films.

The film thickness of these different types of dielectric insulating thin films obtained herein, and the molar ratio of the metal atom, the oxygen atom and the carbon atom in these films, as derived from the peak area in XPS of the films, are shown in Table 2. In Table 2, the film thickness is an average value of three test samples, and the XPS peak used for the quantitative determination of each element is for Ti 2p, Zr 3d, Ta 3d, O 1, and C 1s.

TABLE 2

| Metal Oxide | Film Thickness (nm) | Constitutive Element Ratio (at. %) |
|---|---|---|
| TiO$_2$ | 19 | Ti: 28, O: 67, C: 5 |
| ZrO$_2$ | 17 | Zr: 31, O: 66, C: 3 |
| Ta$_2$O$_3$ | 16 | Ta: 25, O: 69, C: 6 |

As in Table 2, the dielectric insulating thin film obtained herein all had a thickness of at most 20 nm on average, and the amount of the carbon remaining in the films was a few percentage. In consideration of the influence of organic molecules adsorbed by the surface of the test sample and of the fact that even high-quality dielectric thin films produced according to a vapor-phase deposition method of PECVD (plasma enhanced CVD) of ALD may contain from 3 to 8% of C (e.g., see Y. Kim, et al., *J. Appl. Phys.*, 92, p. 5443 (2002)), it may be said that the metal oxide dielectric thin films produced in the invention are extremely thin and have high purity.

Example 2

Formation of Laminate Thin Film of Dielectric Insulating Thin Films of Transition Metal Oxide (Nano-laminate Dielectric Film)

The silicon substrate with a hydroxyl group formed in its surface according to the above-mentioned method was dipped in a solution of 100 mM titanium butoxide (Ti(O-nBu)$_4$) dissolved in a 1/1 mixed solvent of toluene and ethanol, at 30° C. for 3 minutes, and then this was dipped in ethanol at 30° C. for 1 minute for washing to remove the excessive metal alkoxide molecules. Next, this was dipped in ion-exchanged water at 30° C. for 1 minute for hydrolysis, and finally this was dried with a nitrogen gas jet applied thereto to form a titanium oxide gel ultra-thin film deposited thereon. Next, the substrate with the titanium oxide gel ultra-thin film deposited thereon was dipped in a solution of 50 mM tantalum ethoxide (Ta(OEt)$_5$) dissolved in a 1/1 mixed solvent of toluene and ethanol, at 30° C. for 3 minutes, and then dipped in ethanol at 30° C. for 1 minute for washing so as to remove the excessive metal alkoxide molecules. This was then dipped in ion-exchanged water at 30° C. for 1 minute for hydrolysis, and finally dried with a nitrogen gas jet applied thereto to form a tantalum oxide gel ultra-thin film laminated thereon. The alternate deposition treatment of the titanium oxide gel ultra-thin film and the tantalum oxide gel ultra-thin film was repeated 10 times to form a titanium oxide/tantalum oxide gel laminate thin film one after another. Thus formed, the laminate thin film was irradiated with oxygen plasma under an oxygen pressure of $1.83 \times 10^4$ Pa (183 mbar) and under an output power condition of 30 W for 40 minutes, and then fired in a nitrogen atmosphere at 400° C. for 15 minutes to thereby form a titanium oxide/tantalum oxide laminate thin film ((TiO$_2$/Ta$_2$O$_5$)$_{10}$) (nano-laminate dielectric film).

In the same manner as above but using a solution of 50 mM zirconium isopropoxide (Zr(O-iPr)$_4$) dissolved in a 1/1 mixed solvent of toluene and ethanol and a solution of 50 mM tantalum ethoxide (Ta(OEt)$_5$) therein, a zirconium oxide/tantalum oxide laminate thin film (nano-laminate dielectric film) ((ZrO$_2$/Ta$_2$O$_5$)$_{10}$) was formed.

Figure 2:
FIG. 2 shows scanning electromicroscopic photographs of the surface of a titanium oxide/tantalum oxide laminate thin film of the invention (2A-1) and the cross section thereof (2A-2); and the surface of a zirconium oxide/tantalum oxide laminate thin film of the invention (2B-1) and the cross section thereof (2B-2). In 2A-1 and 2B-1, one division of the scale is 50 nm; and in 2A-2 and 2B-2, it is 20 nm.
Figure 2:
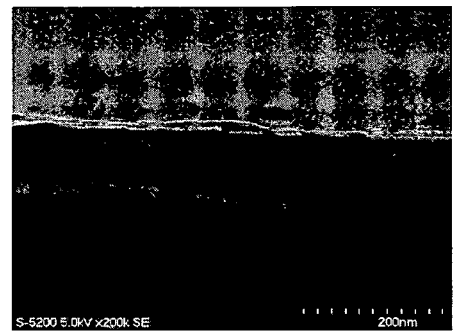
Figure 2:
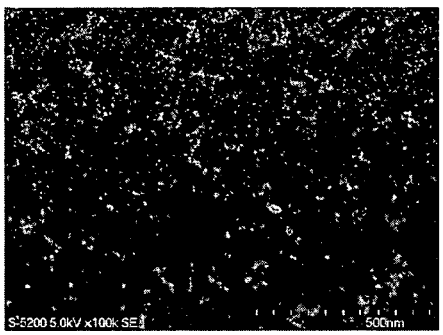
Figure 2:
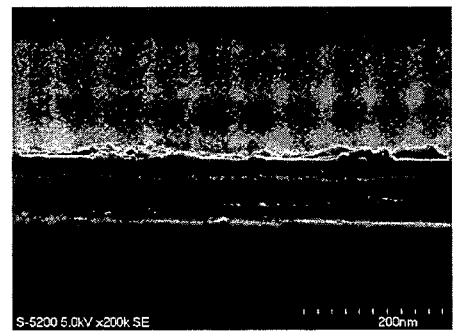

FIG. 2 shows photographs of the surface and the cross section of the titanium oxide/tantalum oxide laminate thin film and the zirconium oxide/tantalum oxide laminate thin film obtained according to the method as above, taken through a scanning electronic microscope. From FIG. 2, it is understood that the laminate thin films obtained according to the production method of the invention are dense oxide ultra-thin films having a uniform thickness, like the dielectric insulating thin films of metal oxide formed in Example 1.

The film thickness of the laminate thin films and the molar ratio of the metal atom, the oxygen atom and the carbon atom in these laminates, as derived from the peak area in XPS of the films, are shown in Table 3.

TABLE 3

| Laminate Thin film | Constitutive Element Ratio (at. %) | Film Thickness (nm) |
| --- | --- | --- |
| (TiO$_2$/Ta$_2$O$_5$)$_{10}$ | Ti: 17, Ta: 11, O: 65, C: 7 | 22 |
| (ZrO$_2$/Ta$_2$O$_5$)$_{10}$ | Zr: 15, Ta: 12, O: 66, C: 7 | 21 |

From Table 3, it is understood that all the laminate films have only an extremely minor amount of the remaining organic (carbon) component and high-purity metal oxide thin films were formed, like in Example 1.

Example 3

Formation of Laminate Thin Film of Dielectric Insulating Thin Films of Transition Metal/rare Earth Metal Oxide The silicon substrate with a hydroxyl group formed in its surface according to the method described in Example 1 was dipped in a solution of 100 mM titanium butoxide (Ti(OBu)$_4$) dissolved in a 1/1 mixed solvent of toluene and ethanol, at 30° C. for 3 minutes, and then this was dipped in ethanol at 30° C. for 1 minute for washing to remove the excessive titanium butoxide molecules. Next, this was dipped in ion-exchanged water at 30° C. for 1 minute for hydrolysis, and finally this was dried with a nitrogen gas jet applied thereto to form a titanium oxide gel ultra-thin film deposited thereon. Next, the substrate with the titanium oxide gel ultra-thin film deposited thereon was dipped in an aqueous solution of 1 mM lanthanum nitrate (La(NO$_3$)$_3$6H$_2$O) at 20° C. for 1 minute to thereby form a lanthanum oxide gel deposited thereon, and then this was dipped in ion-exchanged water for 1 minute to remove the excessive lanthanum hydrate ion and to promote the hydrolysis of the lanthanum oxide gel, thereby forming a lanthanum oxide gel ultra-thin layer.

The alternate deposition treatment of the titanium oxide gel ultra-thin layer and the lanthanum oxide gel ultra-thin layer was repeated 10 times to form a titanium oxide/lanthanum oxide gel laminate thin film. Thus formed, the laminate film was irradiated with oxygen plasma under an oxygen pressure of $1.83 \times 10^4$ Pa (183 mbar) and under a plasma output power condition of 30 W for 30 minutes, and then thermally treated in a nitrogen atmosphere at 400° C. for 15 minutes to thereby form a titanium oxide/lanthanum oxide laminate thin film ((TiO$_2$/La$_2$O$_3$)$_{10}$).

In the same manner as above but using a solution of 50 mM zirconium isopropoxide (Zr(O$^{-i}$Pr)$_4$) dissolved in a 1/1 mixed solvent of toluene and ethanol and an aqueous solution of 1 mM lanthanum nitrate (La(NO$_3$)$_3$6H$_2$O), a zirconium oxide/lanthanum oxide laminate thin film ((ZrO$_2$/La$_2$O$_3$)$_{10}$) was formed.

Also in the same manner as above but using a solution of 100 mM titanium butoxide (Ti(O-nBu)$_4$) dissolved in a 1/1 mixed solvent of toluene and ethanol, an aqueous solution of 1 mM lanthanum nitrate (La(NO$_3$)$_3$6H$_2$O), and a solution of 50 mM tantalum ethoxide (Ta(OEt)$_5$) dissolved in a 1/1 mixed solvent of toluene and ethanol, a zirconium oxide/lanthanum oxide/tantalum oxide laminate thin film ((ZrO$_2$/La$_2$O$_3$/Ta$_2$O$_5$)$_6$) was formed.

Figure 3:
FIG. 3 shows scanning electromicroscopic photographs of the surface of a titanium oxide/lanthanum oxide laminate thin film of the invention (3A-1) and the cross section thereof (3A-2); and the surface of a zirconium oxide/lanthanum oxide laminate thin film of the invention (3B-1) and the cross section thereof (3B-2). In 3A-1 and 3B-1, one division of the scale is 50 nm; and in 3A-2 and 3B-2, it is 20 nm.
Figure 3:
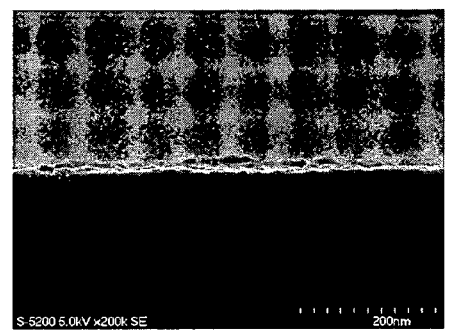
Figure 3:
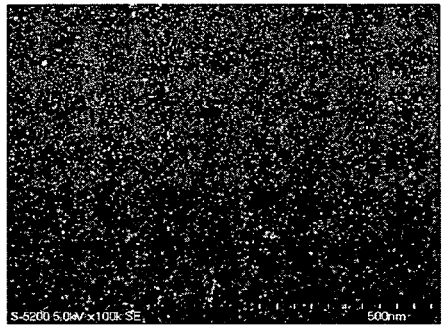
Figure 3:
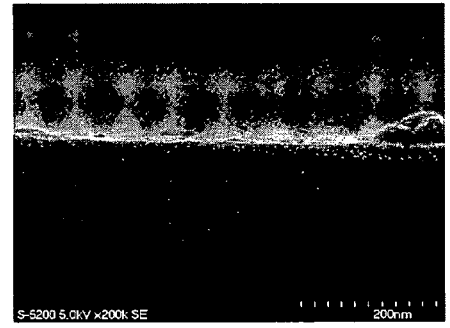

FIG. 3 shows photographs of the surface and the cross section of the titanium oxide or zirconium oxide/lanthanum oxide laminate thin film and the zirconium oxide/lanthanum oxide/tantalum oxide laminate thin film obtained according to the method as above, taken through a scanning electronic microscope. From FIG. 3, it is understood that the laminate thin films obtained according to the production method of the invention are all dense thin films having a uniform thickness.

The film thickness of the laminate thin films and the molar ratio of the metal atom, the oxygen atom and the carbon atom in these laminates, as derived from the peak area in XPS of the films, are shown in Table 4.

TABLE 4

| Laminate Thin film | Constitutive Element Ratio (at. %) | Film Thickness (nm) |
| --- | --- | --- |
| (TiO$_2$/La$_2$O$_3$)$_{10}$ | Ti: 24, La: 8, O: 64, C: 4 | 18 |
| (ZrO$_2$/La$_2$O$_3$)$_{10}$ | Zr: 21, La: 9, O: 63, C: 7 | 17 |
| (TiO$_2$/La$_2$O$_3$/Ta$_2$O$_5$)$_6$ | Ti: 16, La: 3, Ta: 9, O: 65, C: 7 | 19 |

From Table 4, it is understood that all the laminate thin films have only an extremely minor amount of the remaining organic (carbon) component and high-purity metal oxide thin films were formed, like in Examples 1 and 2.

Example 4

Formation of Silica/organic Molecule Hybrid Dielectric Insulating Thin Film

In this Example, using silica (SiO$_2$) known as a low-dielectric-constant substance, formed was a silica/organic molecule hybrid dielectric insulating material.

Silicon ethoxide, ethanol, water and hydrochloric acid were mixed in a ratio of 1:8:4:0.007, and stirred for 24 hours. To 100 ml of the resulting solution, added was 4 ml of an aqueous solution of ammonia (NH$_4$) (0.1 mol/liter), serving as a catalyst for promoting the hydrolytic polymerization of silicon ethoxide, and stirred for 1 hour to prepare a silicon ethoxide sol. In the silicon ethoxide sol, dipped was a silicon substrate having a hydroxyl group in its surface that had been prepared according to the method of Example 1 at 50° C. for 3 minutes, and then this was dipped in ethanol at 50° C. for 1 hour for washing to remove the excessive titanium butoxide molecules. Next, this was dipped in ion-exchanged water at 50° C. for 1 minute, and finally dried with a nitrogen gas jet applied thereto to form a silica gel ultra-thin layer deposited on the substrate. Next, the substrate thus having the silica gel ultra-thin layer deposited thereon was dipped in an aqueous solution of polydiallyldimethylammonium hydrochloride (PDDA) (1 mg/ml) at 20° C. for 1 minute so that PDDA was electrostatically adsorbed by the layer, and then this was dipped in ion-exchanged water for 1 minute to remove the excessive polymer, and a PDDA ultra-thin layer was thus formed thereon. The alternate deposition treatment for the silica gel ultra-thin layer and the PDDA ultra-thin layer was repeated 10 times to thereby form a silica gel/PDDA laminate thin film. Thus obtained, the laminate thin film was treated according to the following method A or B. The method A comprises irradiation of the film with oxygen plasma under an oxygen pressure of 1.83×10$^4$ Pa (183 mbar) and under a plasma output power condition of 30 W for 40 minutes; and the method B comprises irradiation of the film with oxygen plasma under an oxygen pressure of 1.83×10$^4$ Pa (183 mbar) and under a plasma output power condition of 30 W for 40 minutes followed by firing treatment in a nitrogen atmosphere at 400° C. for 15 minutes. Thus treated, a silica/organic molecule hybrid dielectric insulating thin film was produced.

Figure 4:
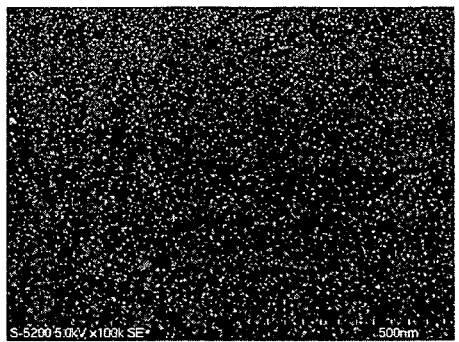
FIG. 4 shows scanning electromicroscopic photographs of the surface of a silica/PDDA hybrid dielectric insulating thin film produced according to the treatment method A of the production method of the invention (Method A-1) and the cross section thereof (Method A-2); and the surface of a silica/PDDA hybrid dielectric insulating thin film produced according to the treatment method B of the production method of the invention (Method B-1) and the cross section thereof (Method B-2). In Method A-1 and Method B-1, one division of the scale is 50 nm; and in Method A-2 and Method B-2, it is 20 nm.
Figure 4:
Figure 4:
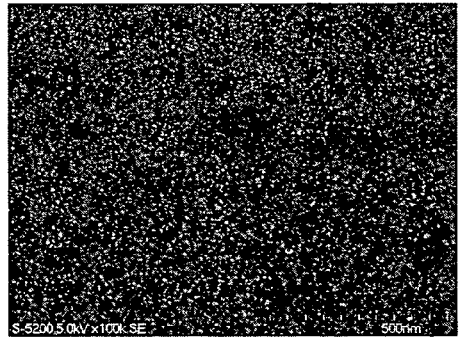
Figure 4:
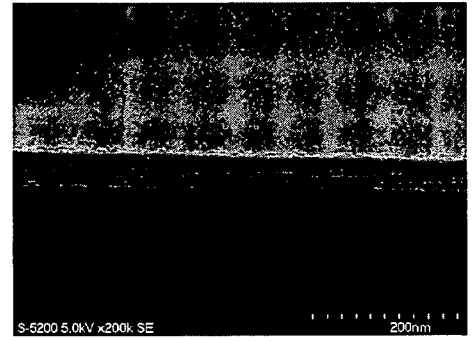

FIG. 4 shows photographs of the surface and the cross section of the silica/organic molecule hybrid dielectric insulating thin films obtained herein, taken through a scanning electronic microscope. From FIG. 4, it is understood that both the above-mentioned methods A and B gave dense silica/organic molecule hybrid dielectric insulating thin films having a uniform thickness.

The film thickness of the silica/organic molecule hybrid dielectric insulating films treated according to the above-mentioned Method A or B, and the compositional ratio of silicon, carbon and oxygen in the insulating films, as derived from the peak area in XPS of the films, are shown in Table 5.

TABLE 5

| Treatment Method | Composition (at. %) | Film Thickness (nm) |
| --- | --- | --- |
| Method A | Si: 9, C: 61, O: 30 | 14 |
| Method B | Si: 18, C: 36, O: 46 | 12 |

From Table 5, it is understood that the silica/organic molecule nano-hybrid dielectric insulating thin films obtained in the methods A and B both form hybrid thin films having a thickness of less than 20 nm.

Example 5

Determination of Dielectric Constant of Metal Oxide Thin Film (1) Fabrication of Al Metal-metal Oxide Dielectric Insulating Thin Film-Si Substrate (MIS) Capacitor:

In order to determine and evaluate the dielectric constant and the insulating property of the metal oxide dielectric insulating thin film formed in Example 1, an aluminium electrode was formed on the metal oxide dielectric insulating thin film formed on a silicon substrate, according to a vacuum evaporation process to fabricate a MIS (metal-insulator-semiconductor) capacitor. The aluminium deposition was effected as follows: The surface of the metal oxide dielectric insulating thin film was covered with a stainless mold, and while the deposition thickness was controlled by the use of a film thickness gauge, an aluminium button electrode having a diameter of 3 mm and a thickness of 150 nm was formed on the film.

Figure 5:
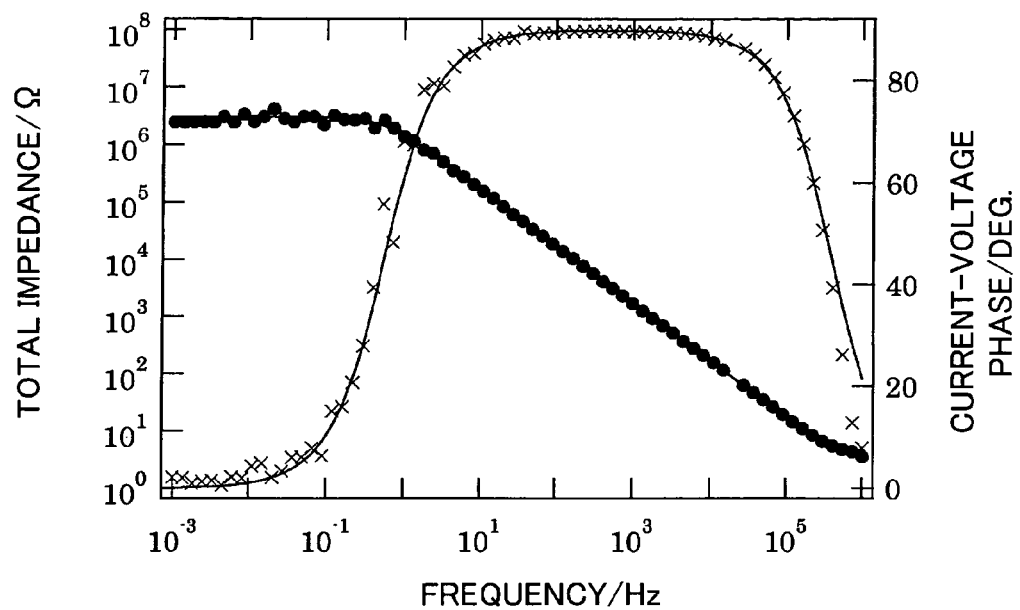
FIG. 5 shows impedance board plots of a titanium oxide dielectric insulating thin film of the invention.

(2) Determination of Dielectric Constant of Metal Oxide Dielectric Thin film:

The relative dielectric constant of the metal oxide dielectric insulating thin film produced in Example 1 was determined according to an impedance spectrometric process. The impedance spectrometry is as follows: The above-mentioned MIS capacitor was analyzed according to a 2-terminal process with the aluminium button electrode and the silicon substrate electrode. FIG. 5 shows the data of the total impedance (|Z|) and the current-voltage phase difference ($\phi$) plotted relative to the alternating current frequency.

In FIG. 5, (●) indicates the measured data of the total impedance (|Z|); (x) indicates the measured data of the current-voltage phase difference ($\phi$). FIG. 5 shows the linear frequency dependence of the total impedance (|Z|) and the current-voltage phase difference ($\phi$) of about 90°, within the range of from 10$^{-1}$ to 10$^6$ Hz. This confirms that the metal oxide dielectric insulating thin film produced in Example 1 has a large capacitance.

Figure 6:
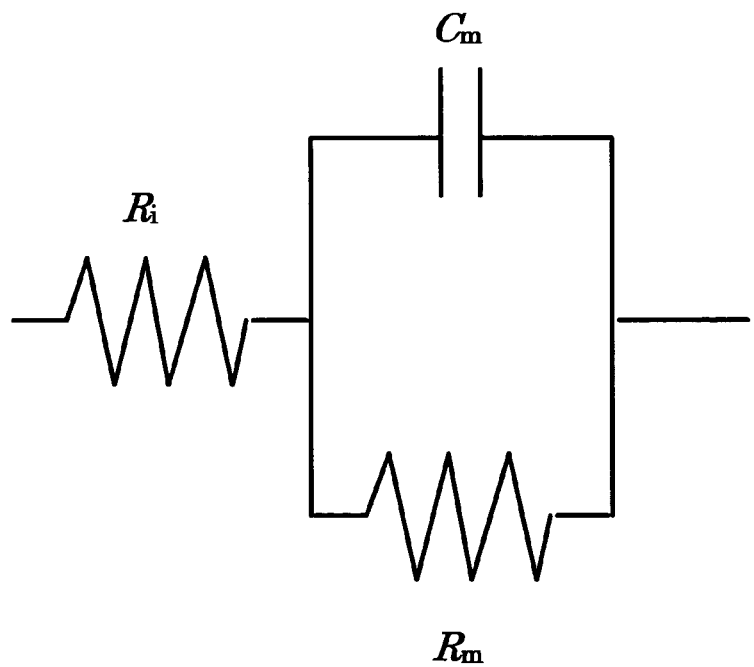
FIG. 6 is an equivalent circuit model to the impedance response of an aluminium-metal oxide dielectric insulating thin film-silicon semiconductor substrate (MIS) capacitor of the invention.

FIG. 6 shows an equivalent circuit to the impedance response of the MIS capacitor. In FIG. 6, $R_m$ indicates the alternating current resistance of the metal oxide dielectric insulating thin film; and $C_m$ indicates the capacitance of the metal oxide dielectric insulating thin film. $R_i$ indicates the electric resistance in the interface between the metal oxide dielectric insulating thin film and the electrode. The impedance Z of the equivalent circuit as in FIG. 6 is represented by the following equation (1):

$$Z = R_i + \frac{1}{j\omega C_m + \frac{1}{R_m}} \quad (1)$$

When the equation (1) is expanded, then the impedance Z is represented by complex numbers of the following equations (2).

$$Z = X_1 + jX_2 \quad (2)$$

$$X_1 = R_i + \frac{R_m}{1 - \varpi^2 C_m^2 R_m^2}$$

-continued $$X_2 = \frac{\varpi C_m R_m^2}{1 - \varpi^2 C_m^2 R_m^2}.$$

In the numerical formulae (1) and (2), j indicates the imaginary factor and ω indicates the alternating current frequency.

The level of the principal impedance (total impedance) |Z|, and the current-voltage phase (φ) in the equivalent circuit shown in FIG. 6 may be represented as in the following equations (3), as a function to the alternating current frequency ω.

$$|Z| = \sqrt{X_1^2 + X_2^2} \quad (3)$$

$$\varphi = \tan^{-1}\frac{X_2}{X_1}$$

From the equations (3), the resistance ($R_m$) and the capacitance ($C_m$) of the titanium oxide thin film were determined, as computed according to a least square method where $R_m$, $C_m$ and $R_t$ are variable parameters and the theoretical impedance and current-voltage-voltage phase difference curves are fitted to the curves of the measured data. The theoretical impedance and phase difference curves of the titanium oxide thin film as computed according to the least square method with the equivalent circuit model of FIG. 6 are designated by full lines in FIG. 5. As in FIG. 5, the measured data and the theoretical data well correspond to each other, and the difference between the two is less than 1%.

From the above-mentioned analysis, the alternating current resistance and the capacitance of the titanium oxide thin film were determined. From $C_m$, the relative dielectric constant was determined according to the following equation (4), using the titanium oxide dielectric film thickness (d) and the MIS capacitor electrode area ($S = 0.0707$ cm$^2$) obtained in Example 1.

$$C = \frac{\varepsilon_r \varepsilon_0 S}{d} \quad (4)$$

In the equation (4), $\in_r$ and $\in_0$ indicate the relative dielectric constant and the dielectric constant in vacuum, respectively.

Table 6 shows the capacitance ($C_m$), the alternating current resistance ($R_m$) and the relative dielectric constant ($\in_r$) of the titanium oxide dielectric insulating thin film, as determined from the above-mentioned impedance analysis.

In addition, the zirconium oxide and tantalum oxide dielectric insulating thin films were also subjected to impedance spectrometry and analysis in the same manner as above. The capacitance ($C_m$), the alternating current resistance ($R_m$) and the relative dielectric constant ($\in_r$) of these films are shown in Table 6.

TABLE 6

| Dielectric Insulating Thin Film | $R_m$ (Ω) | $C_m$ (nF) | $\in_r$ |
|---|---|---|---|
| TiO$_2$ | 3.02 × 10$^6$ | 94.7 | 29 |
| ZrO$_2$ | 3.20 × 10$^7$ | 51.1 | 15 |
| Ta$_2$O$_5$ | 1.30 × 10$^8$ | 49.3 | 14 |

As in Table 6, the relative dielectric constant of the metal oxide dielectric insulating thin films obtained according to the production method of the invention is high, comparable to that of metal oxide thin films that are obtained through vapor-phase deposition such as ALD or MBE. This may be because of the following reasons. In the production method of the invention, a metal oxide dielectric insulating thin film is formed through firing treatment at a relatively low temperature, and therefore an SiO$_x$ phase having a low dielectric constant is not formed in the interface of Si/oxide. In addition, since the method is for bottom-up thin film formation that comprises laminating molecule-level oxide gel ultra-thin layers according to a surface sol-gel process, it gives thin films of higher density than those formed in a top-down film formation system of spin-coating or the like. For these reasons, oxide dielectric thin films having a high dielectric constant can be formed in the method of the invention.

Example 6

Figure 7:
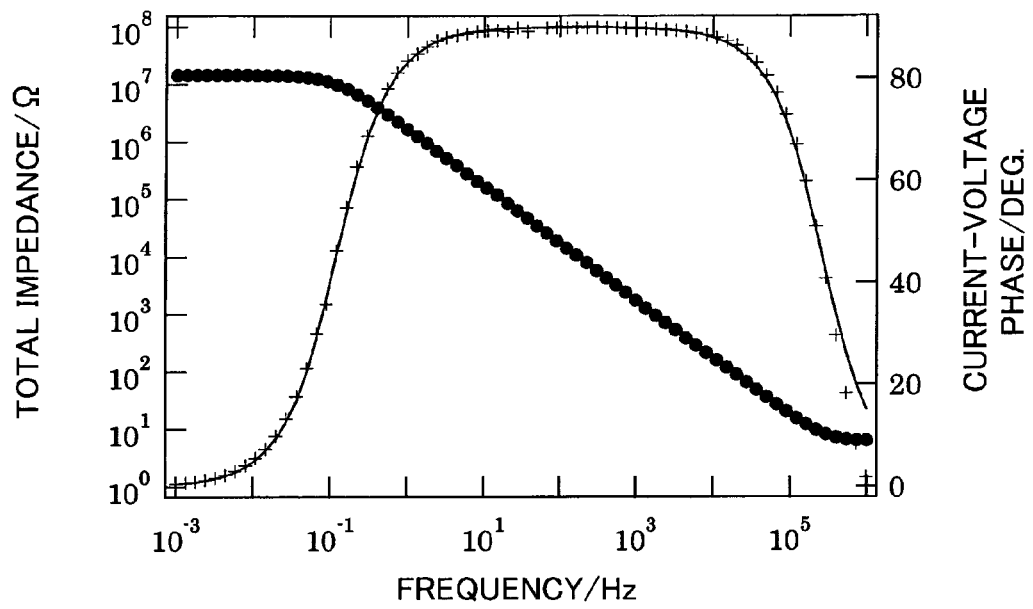
FIG. 7 shows impedance board plots of a titanium oxide/tantalum oxide laminate thin film of the invention.

Determination of Dielectric Constant of Metal Oxide Nano-laminate Dielectric Film The relative dielectric constant of the metal oxide laminate thin film produced in Examples 2 and 3 was determined according to an impedance spectrometric method. The impedance spectrometry and the analysis were carried out in the same manner as in Example 5. FIG. 7 shows the data of the total impedance (|Z|) and the current-voltage phase difference (φ) of the titanium oxide/tantalum oxide laminate thin film, as plotted relative to the alternating current frequency.

Table 7 shows the capacitance ($C_m$), the alternating current resistance ($R_m$) and the relative dielectric constant ($\in_r$) of the film, as determined from the impedance analysis. In addition, the results of the impedance analysis of the other metal oxide laminate thin films produced in Examples 2 and 3 are shown in Table 7.

TABLE 7

| Laminate Thin Film | $R_m$ (Ω) | $C_m$ (nF) | $\in_r$ |
|---|---|---|---|
| (TiO$_2$/Ta$_2$O$_5$)$_{10}$ | 1.46 × 10$^7$ | 91.6 | 32 |
| (TiO$_2$/La$_2$O$_3$)$_{10}$ | 2.29 × 10$^8$ | 113 | 33 |
| (ZrO$_2$/Ta$_2$O$_5$)$_{10}$ | 1.77 × 10$^9$ | 51.0 | 18 |
| (ZrO$_2$/La$_2$O$_3$)$_{10}$ | 9.93 × 10$^7$ | 77.8 | 21 |
| (TiO$_2$/La$_2$O$_3$/Ta$_2$O$_5$)$_6$ | 1.22 × 10$^8$ | 93.2 | 30 |

As in Table 7, (TiO$_2$/Ta$_2$O$_5$)$_{10}$ and (ZrO$_2$/Ta$_2$O$_5$)$_{10}$ have a higher relative dielectric constant than the single phase of TiO$_2$, ZrO$_2$ and Ta$_2$O$_5$. The dielectric constant of (TiO$_2$/La$_2$O$_3$)$_{10}$ and (ZrO$_2$/La$_2$O$_3$)$_{10}$ increased by 10% and 20%, respectively, than that of TiO$_2$ and ZrO$_2$ thin films.

Heretofore there is a report saying that adding any of Hf, Nb or Sn to thin films of TiO$_2$, ZrO$_2$ and Ta$_2$O$_5$ gave oxide dielectric thin films having a high dielectric constant (e.g., R. B. van Dover, et al., *Nature*, 392, 162 (1998); H. Zhang, et al., *J. Appl. Phys.*, 87, 1921 (2000)). However, there is found no report of a dielectric thin film that a dielectric constant of larger than 30 for an ultra-thin film material having a thickness of about 20 nm or so. In addition, there is also found no example of producing an ultra-thin film material of (TiO$_2$/La$_2$O$_3$)$_{10}$ and (ZrO$_2$/La$_2$O$_3$)$_{10}$.

From the above, it is understood that, according to the production method of the invention, a dielectric thin film having a dielectric constant of 30 or more can be designed. In addition, it may be considered that, depending on the combination of thin films to be laminated, thin film laminates having a further higher dielectric constant may be obtained.

Example 7

Figure 8:
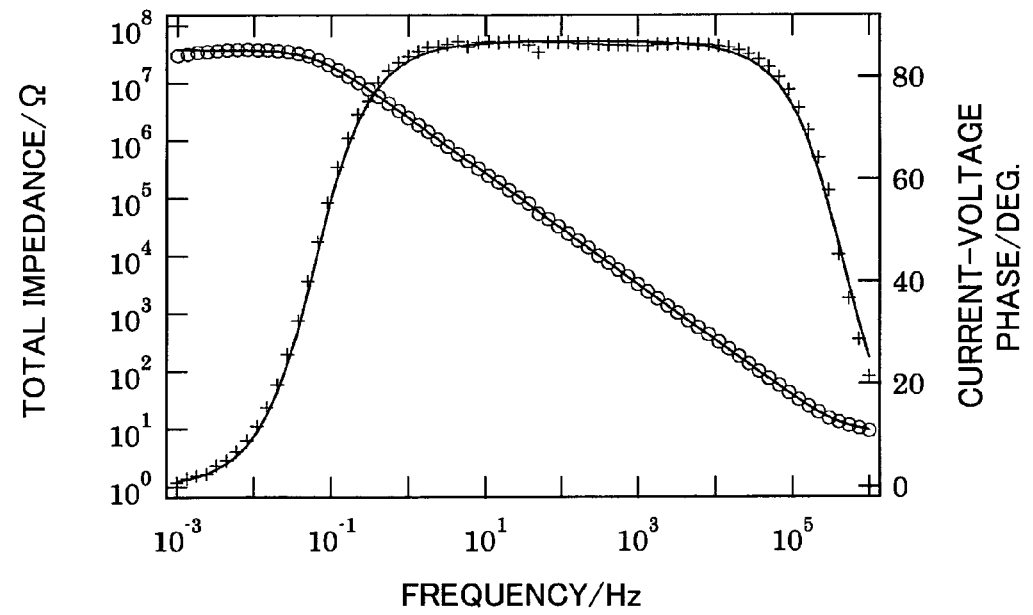
FIG. 8 shows impedance board plots of a silica/PDDA hybrid dielectric thin film treated according to a method A.

Dielectric Constant of Silica/organic Molecule Nano-hybrid Dielectric Thin Film The relative dielectric constant of the silica/organic molecule nano-hybrid dielectric insulating thin film produced in Example 4 was determined according to an impedance spectrometric method. The impedance spectrometry and the analysis were carried out in the same manner as in Example 5. FIG. 8 shows the data of the total impedance (|Z|) and the current-voltage phase difference ($\phi$) of the hybrid dielectric thin film produced in Example 4, as plotted relative to the alternating current frequency. The results of the impedance analysis are shown in Table 8, along with the data of the thin films obtained according to the method A and the method B.

TABLE 8

| Treatment Method | $R_m$ ($\Omega$) | $C_m$ (nF) | $\epsilon_r$ |
|---|---|---|---|
| Method A | $1.50 \times 10^6$ | 36.7 | 8.9 |
| Method B | $3.76 \times 10^7$ | 21.2 | 5.6 |

As in Table 8, the films treated by any of the above methods have a higher dielectric constant than that of $SiO_2$ ($\epsilon_r = 3.9$). In addition, it may be considered that, when the types of the polymers to be combined are suitably selected, then thin films having a smaller dielectric constant could be produced.

Example 8

Insulating Property of Dielectric Insulating Thin Film

Figure 9:
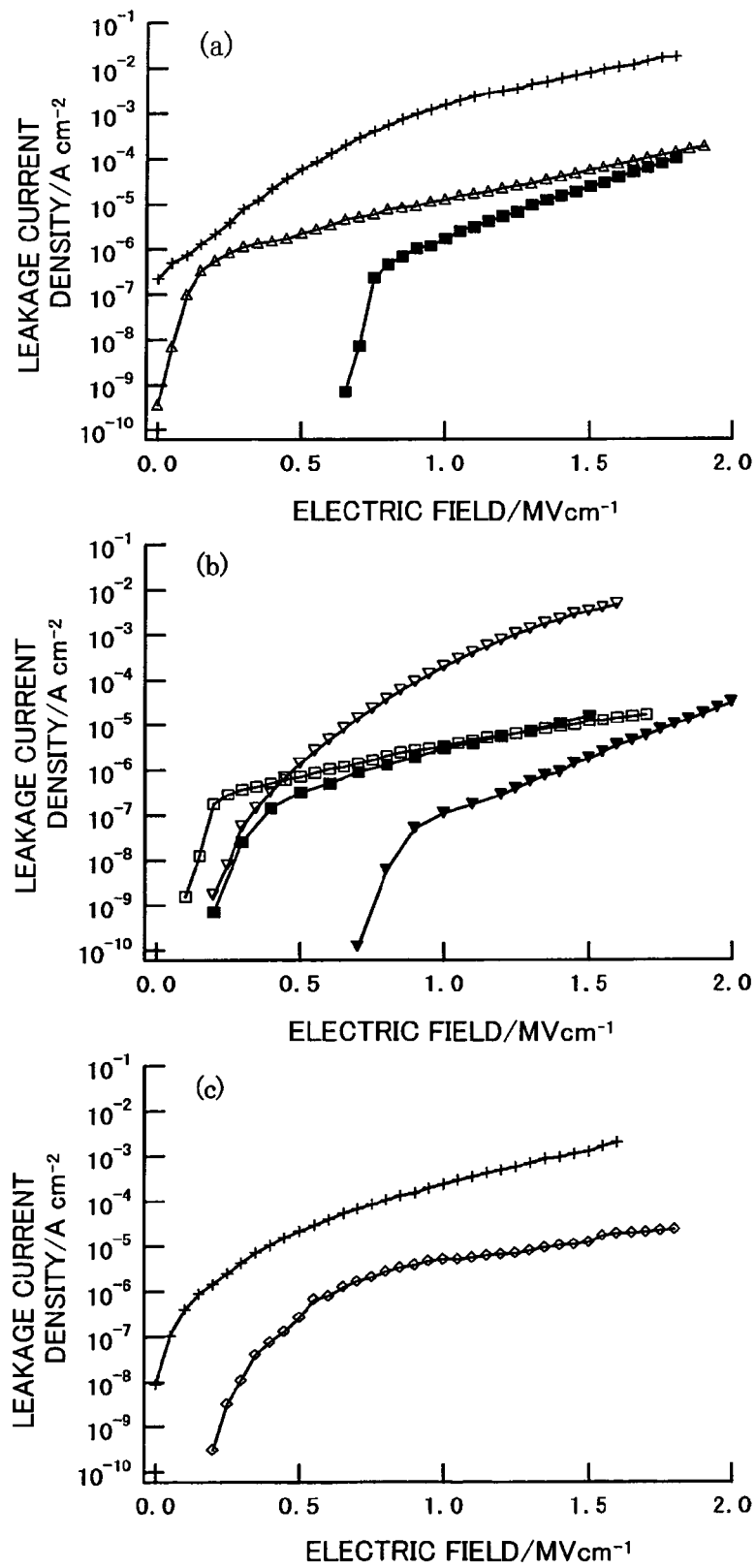
FIG. 9 shows explanatory views indicating the relationship between the leakage current density of a metal oxide dielectric insulating thin film of the invention and the electric field applied to film.

FIG. 9 shows the relationship between the leakage current density of each dielectric insulating thin films produced in Examples 1 to 4 and the electric field curve applied thereto. In FIG. 9, (a) shows the relationship between the leakage current density of a single-layer structure and the electric field curve thereto; (plus mark) indicates $TiO_2$; (triangle mark) indicates ZrO; and (dark square mark) indicates $Ta_2O_5$. (b) shows the relationship between the leakage current density of a laminate structure and the electric field curve thereto; (reversed triangle mark) indicates $(TiO_2/Ta_2O_5)_{10}$; (square mark) indicates $(TiO_2/La_2O_3)_{10}$; (reversed dark triangle mark) indicates $(ZrO_2/Ta_2O_5)_{10}$; (dark square mark) indicates $(TiO_2/La_2O_3)_{10}$. (c) shows the relationship between the leakage current density of the silica/organic-inorganic hybrid dielectric insulating thin film $(SiO_2/PDDA)_{20}$, and the electric field curve thereto; (plus mark) indicates the method A; and the (diamond mark) indicates the method B. Table 9 shows the data of the leakage current density of the samples in an electric field of 1 MV cm$^{-1}$.

TABLE 9

| Dielectric Insulating Thin Film | Leakage Current Density (A cm$^{-2}$) |
|---|---|
| $TiO_2$ | $1.6 \times 10^{-3}$ |
| $ZrO_2$ | $9.0 \times 10^{-6}$ |
| $Ta_2O_5$ | $8.0 \times 10^{-6}$ |
| $(TiO_2/Ta_2O_5)_{10}$ | $1.9 \times 10^{-4}$ |

TABLE 9-continued

| Dielectric Insulating Thin Film | Leakage Current Density (A cm$^{-2}$) |
|---|---|
| $(TiO_2/La_2O_3)_{10}$ | $3.3 \times 10^{-6}$ |
| $(ZrO_2/Ta_2O_5)_{10}$ | $1.1 \times 10^{-7}$ |
| $(ZrO_2/La_2O_3)_{10}$ | $3.1 \times 10^{-6}$ |
| $(TiO_2/La_2O_3/Ta_2O_5)_6$ | $4.5 \times 10^{-7}$ |
| $(SiO_2/PDDA)_{10}$ (method A) | $1.7 \times 10^{-4}$ |
| $(SiO_2/PDDA)_{10}$ (method B) | $5.1 \times 10^{-6}$ |

When the single-layered dielectric insulating thin films are compared with the multi-layered laminate thin films in Table 9, it is known that the lamination of dielectric insulating thin films of different types of metal oxides decreased the leakage current. In particular, the leakage current of the $TiO_2$ dielectric insulating thin film is on the order of $10^{-3}$ and is large, but that of $(TiO_2/La_2O_3)_{10}$ is on the order of $10^{-6}$, or that is, this decreased to 1/1000. Also in the $ZrO_2$-based samples, the leakage current of the multi-layered structures decreased to about 1/10. This may be because of the following reasons. In the production method of the invention, since the firing treatment is effected at a low temperature (400° C.), the $SiO_2$-interface layer grows little and, in addition, the dielectric insulating thin film of metal oxide obtained is dense and contains few organic impurities. From these reasons, it may be said that the high insulating property of the oxide dielectric thin film of the invention would not be derived from the Si substrate/dielectric interface structure but it may be the property intrinsic to the oxide dielectric thin film itself.

On the other hand, the $SiO_2$/PDDA thin film contains a large amount of organic components and has a thickness of 12 nm or so, but its insulating property is good. No one knows any other example of an organic-inorganic hybrid thin film having such a good insulating property.

In consideration of the fact that the practicable limit of the insulating property in DRAM devices is on an order of $10^{-6}$ or so, it may be said that the dielectric insulating thin film, especially the laminate thin film produced in the invention is applicable to insulating capacitors.

Example 9

Fabrication of Hafnium Oxide Dielectric Thin Film (Sol-gel Process)

In this Example, a hafnium oxide ($HfO_2$) ultra-thin film, which is considered as the most hopeful material for high-k gate insulating films in oxide semiconductor field-effect transistors (MOSFET) of the next generation, was produced according to a sol-gel process.

Like in the method of Example 1, a silicone substrate with a hydroxyl group formed in its surface was dipped in a solution of 100 mM hafnium tetrabutoxide (Hf(O-nBu)$_4$) dissolved in a 1/1 mixed solvent of toluene and ethanol, at 30° C. for 3 minutes, and then dipped in ethanol at 30° C. for 1 minute for washing to remove the excessive metal alkoxide molecules. Next, this was dipped in ion-exchanged water at 30° C. for 1 minute for hydrolysis, and finally dried with a nitrogen gas jet applied thereto to form a hafnium oxide gel ultra-thin film deposited thereon.

The deposition treatment of the hafnium oxide gel ultra-thin layer was repeated 10 times to form a metal oxide gel ultra-thin film one after another. Thus formed, the gel thin film was irradiated with oxygen plasma under an oxygen pressure of $1.83 \times 10^4$ Pa (183 mbar) and under an output power condition of 30 W for 40 minutes, and then thermally treated in a nitrogen atmosphere at 400° C. for 15 minutes to thereby form an HfO₂ dielectric thin film (SSG10).

Figure 10:
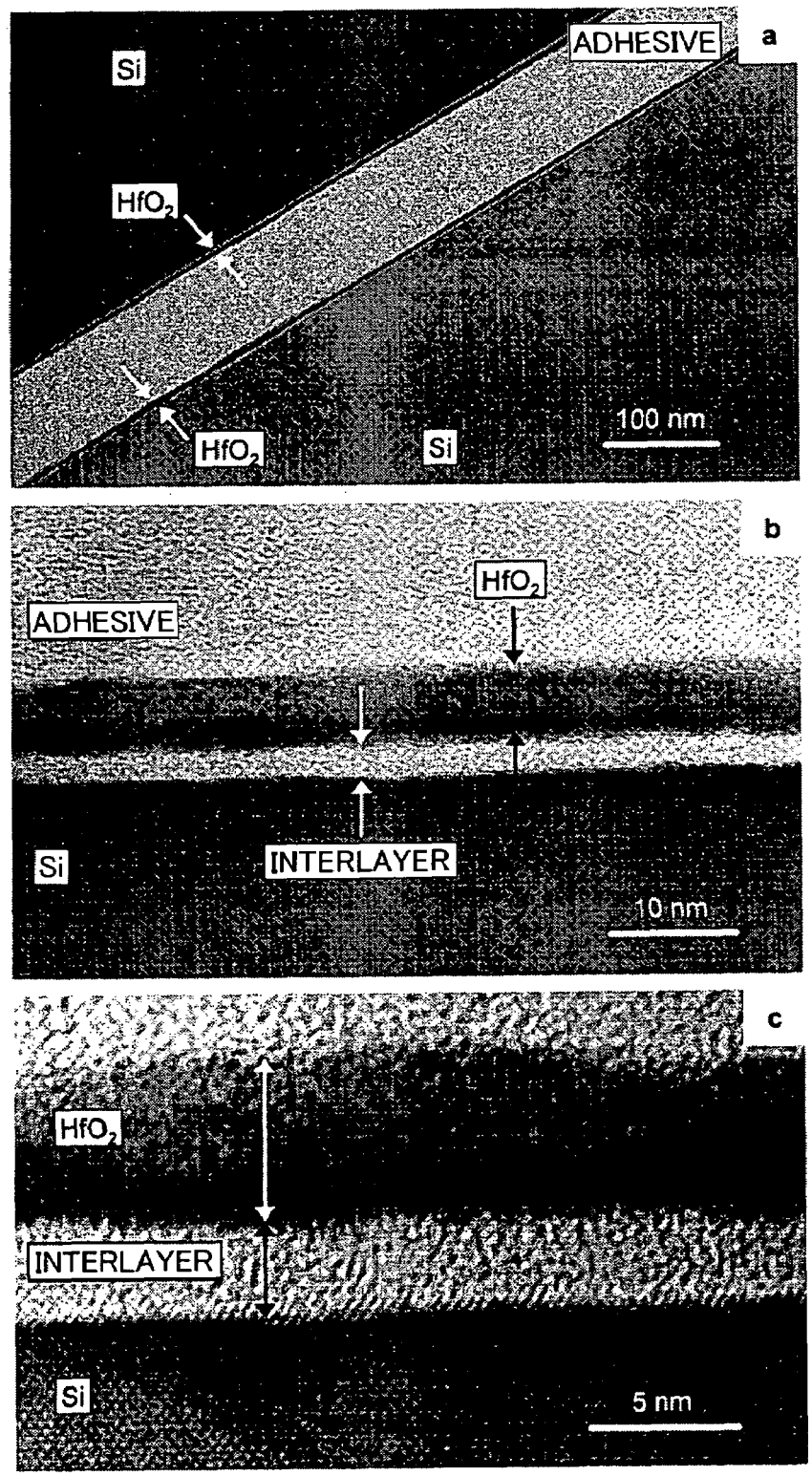
FIG. 10 shows high-resolution transmission electromicroscopic photographs of the cross section of SSG10.

FIG. 10 shows high-resolution transmission electromicroscopic photographs of the cross section of SSG10. As in FIG. 10(a), SSG10 is formed continuously and uniformly, extending over hundreds nm. As in FIG. 10(b), SSG10 comprises an HfO₂ layer having a thickness of 5.7 nm, an Si substrate, and an interlayer having a thickness of 2.9 nm. Its XPS indicates that the interlayer is a uniform SiO₂ layer. As in FIG. 10(c), SSG10 is a dense and amorphous HfO₂ layer having a uniform thickness with neither void nor grain boundary.

Table 10 shows the thickness of the HfO₂ thin film and the SiO₂ interlayer of SSG10.

Example 10

Fabrication of Hafnium Oxide Dielectric Insulating Thin Film (Spin-coating Process)

Figure 11:
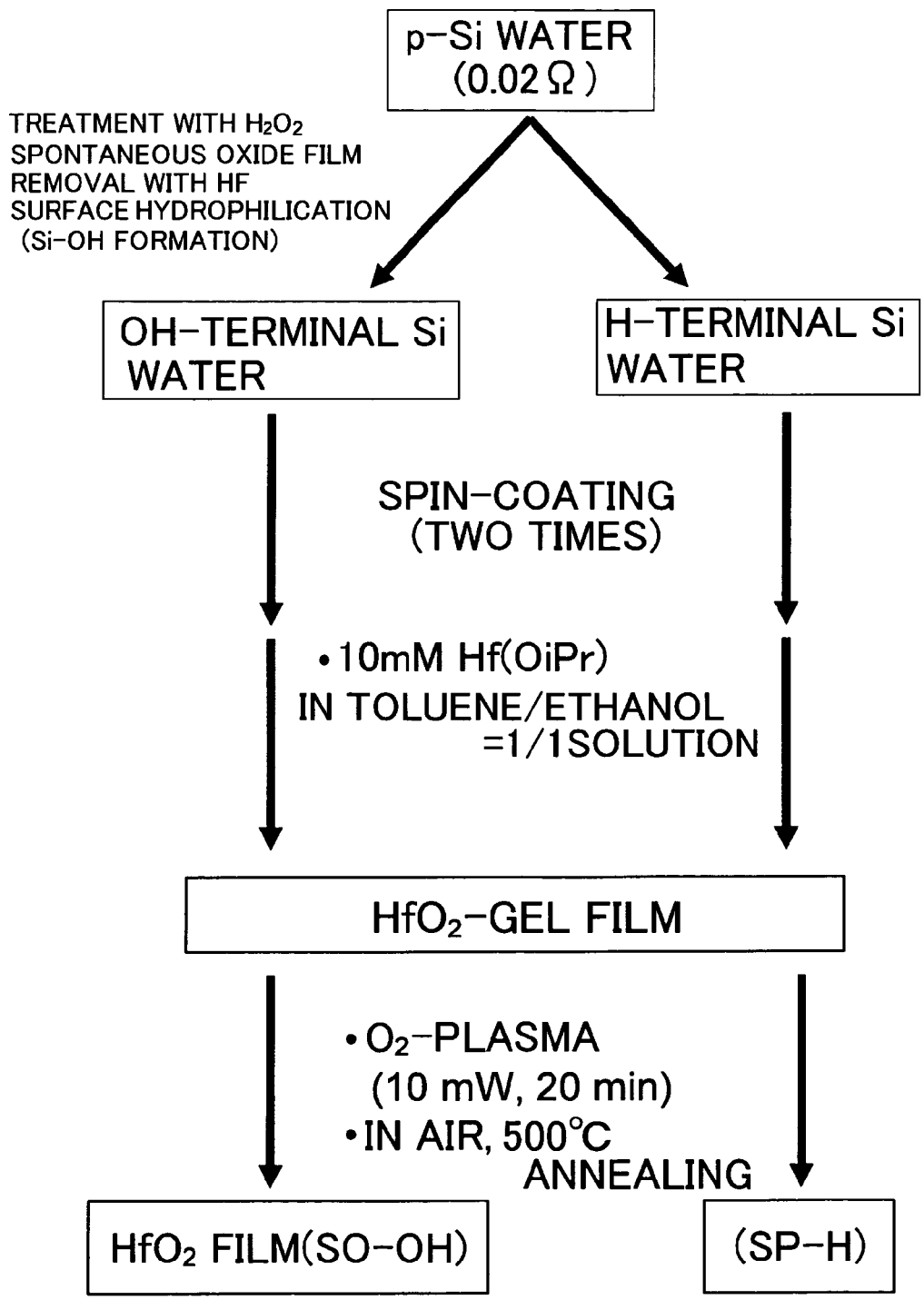
FIG. 11 is a flowchart showing a method for producing an $HfO_2$ dielectric thin film according to a spin-coating process.

According to the spin-coating process shown in FIG. 11, two types of HfO₂ thin films (SP—OH and SP—H) were produced.

Figure 12:
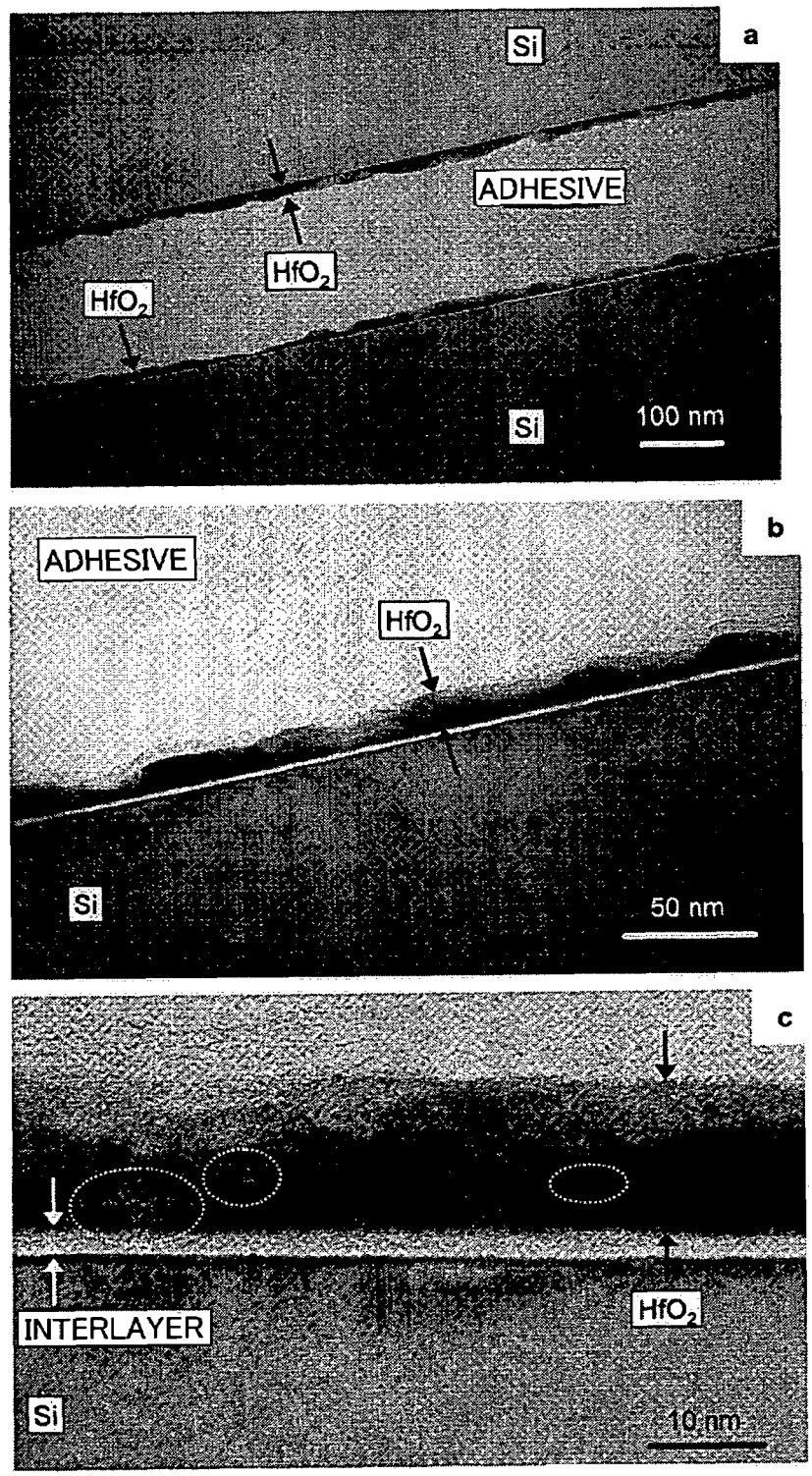
FIG. 12 shows high-resolution transmission electromicroscopic photographs of the cross section of SP—OH.

FIG. 12 shows high-resolution transmission electromicroscopic photographs of the cross section of SP—OH.

As in FIG. 12(a), SP—OH is formed, extending over hundreds nm, but its thickness is not uniform. As in FIG. 12(b), the HfO₂ thin film of SP—OH has a rough surface condition, and it is an uneven film having a thickness of from 5 to 20 nm. As in FIG. 12(c), SP—OH comprises an HfO₂ layer having a mean thickness of 13.4 nm, an Si substrate, and an interlayer having a thickness of 2.4 nm. Its XPS indicates that the interlayer is a uniform SiO₂ layer. As in FIG. 12(c), the density of the HfO₂ thin film of SP—OH is not even, and this means that the thin film of SP—OH has voids formed therein (the area surrounded by the dotted line in FIG. 12(c)). Table 10 shows the mean thickness of the HfO₂ thin film of SP—OH and the thickness of the SiO₂ interlayer.

In addition, Table 10 shows the mean thickness of the HfO₂ thin film of SP—H determined through SEM observation.

TABLE 10

| Type of HfO₂ | HfO₂ Layer/nm | SiO₂ Layer/nm |
|---|---|---|
| SSG10 | 5.7 | 2.9 |
| SP-OH | 13.4 | 2.4 |
| SP-H | 14 | — |

Example 11

Fabrication of Al Metal-HfO₂ Dielectric Insulating Film-Si Substrate (MIS) Capacitor In order to determine and evaluate the dielectric constant and the insulating property of the HfO₂ dielectric ultra-thin film produced in Examples 9 and 10, an aluminium electrode was formed on the HfO₂ dielectric ultra-thin film formed on a silicon substrate, according to a vacuum evaporation process to fabricate a MIS (metal-insulator-semiconductor) capacitor. The aluminium deposition was effected as follows: The surface of the metal oxide dielectric insulating thin film was covered with a stainless mold, and while the deposition thickness was controlled by the use of a film thickness gauge, an aluminium button electrode having a diameter of 3 mm and a thickness of 150 nm was formed on the film.

Example 12

Dielectric Constant of HfO₂ Dielectric Thin Film

The relative dielectric constant of the HfO₂ dielectric ultra-thin film produced in Examples 9 and 10 was determined according to an impedance spectrometric process in the same manner as in Example 5.

Figure 13:
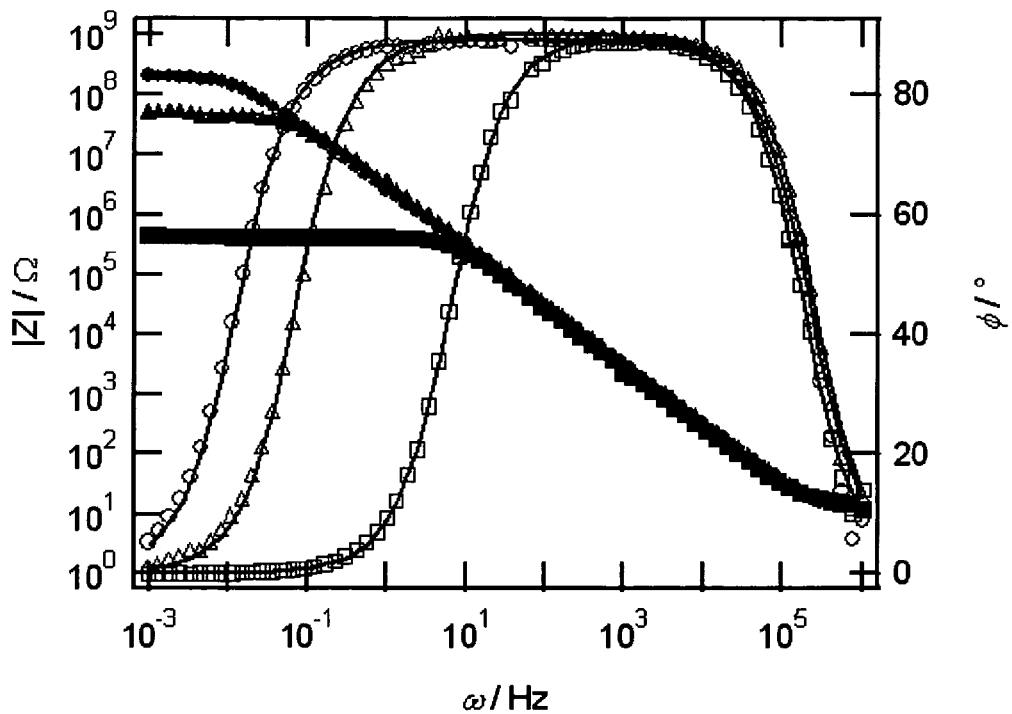
FIG. 13 shows impedance board plots of various $HfO_2$ dielectric thin films.

FIG. 13 shows the data of the total impedance (|Z|) and the current-voltage phase difference ($\phi$) of the SSG10 dielectric thin film plotted relative to the alternating current frequency ($\omega$).

In FIG. 13, the dark solid marks indicate the measured data of the total impedance; and the white marks (circle: SSG10, triangle: SP—OH, square: SP—H) indicates the measured data of the current-voltage phase difference ($\phi$). FIG. 13 shows the linear frequency dependence of the total impedance (|Z|) and the current-voltage phase difference ($\phi$) of about 90° in the range of from $10^{-1}$ to $10^6$ Hz. These characterize a large capacitance of the samples analyzed.

The theoretical impedance and phase difference curves of the dielectric thin film, as computed according to the least square method with the equivalent circuit model of FIG. 6, are designated by full lines in FIG. 13. The measured data and the theoretical data of the samples analyzed well correspond to each other, and the difference between the two is less than 1%.

From the above-mentioned analysis, the alternating current resistance and the capacitance of the SSG10 dielectric thin film were determined. As mentioned in Example 9, the SSG10 dielectric thin film has a two-layered structure of HfO₂/SiO₂ oxide. From $C_m$, the film thickness of the two-layered HfO₂/SiO₂ oxide film obtained in Example 9 (d=8.6 nm), and the MIS capacitor electrode area (S=0.0707 cm²), the relative dielectric constant of the SSG10 dielectric thin film was determined according to the equation (4) shown in Example 5.

The SSG10 dielectric thin film may be considered as a combination of a capacitor with HfO₂ layer and a capacitor with SiO₂ layer connected in series. Accordingly, $C_m$ may be represented by the following equation:

$$C_m = \frac{\varepsilon_r \varepsilon_0 S}{d} = \frac{\varepsilon_{HfO2} \varepsilon_0 S}{d_{HfO2}} + \frac{\varepsilon_{SiO2} \varepsilon_0 S}{d_{SiO2}} \quad (5)$$

In the equation (5), $\varepsilon_{HfO2}$ and $\varepsilon_{SiO2}$ each indicate the relative dielectric constant of the HfO₂ layer and the SiO₂ layer, respectively; $d_H$HfO2 and $d_{SiO2}$ each indicate the film thickness of the HfO₂ layer and the SiO₂ layer, respectively. Based on the film thickness obtained in Example 9 and on the reported value of the relative dielectric constant of SiO₂ ($\varepsilon_{SiO2}$=3.9), the relative dielectric constant of the HfO₂ thin film of SSG10 was determined.

Thus determined through the impedance analysis as above, the capacitance ($C_m$), the alternating current resistance ($R_m$) and the specific dielectric constant ($\varepsilon_r$) of the dielectric thin film of SSG10, and the specific dielectric constant ($\varepsilon_{HfO2}$) of the HfO₂ thin film are shown in Table 11.

In addition, SP—OH and SP—H were analyzed in the same manner as above for the capacitance ($C_m$), the alternating current resistance ($R_m$) and the specific dielectric constant ($\varepsilon_r$) thereof, and for the specific dielectric constant ($\varepsilon_{HfO2}$) of the HfO₂ thin film. The data are given in Table 11.

TABLE 11

| Type of HfO$_2$ | $R_m/\Omega$ | $C_m/nF$ | $\epsilon_r$ | $\epsilon_{HfO2}$ |
|---|---|---|---|---|
| SSG10 | $1.91 \times 10^8$ | 59.7 | 8.2 | 19 |
| SP-OH | $4.59 \times 10^7$ | 47.9 | 12 | 15 |
| SP-H | $4.13 \times 10^5$ | 60.6 | 13 | — |

It is generally reported that the dielectric constant of a bulk of HfO2 is 25 (reference, J. Robertson, *J. Non-Crystalline Solid*, 303, 94 (2002)), but it is known from the Lorentz' local field theory that the dielectric constant of an ultra-thin film is smaller than that of a bulk corresponding to it (Kenji Natori, *Appl. Phys. Lett.*, 73, 632 (1998)). The same phenomenon applies to the thin films formed in vapor-phase deposition such as ALD or MBE.

As in Table 11, the dielectric constant of the HfO$_2$ thin films obtained in the invention is at most 19. On the other hand, the dielectric constant of the HfO$_2$ thin film formed on an Si substrate according to a vapor-phase deposition process is 14 (*J. Appl. Phys.*, 93, 712 (2003)), 18 (*Appl. Phys. Lett.*, 81, 1065 (2002)), 20 (*Microelectron. Eng.*, 69, 145 (2003)), and 21 (*J. Appl. Phys.*, 90, 6466 (2001)).

As compared with the conventional dielectric constant data, it may be said that the dielectric constant of the HfO$_2$ thin film obtained in the invention is large and is enough for dielectric thin films.

Example 13

Insulating Property of HfO$_2$ Dielectric Thin Film

Figure 14:
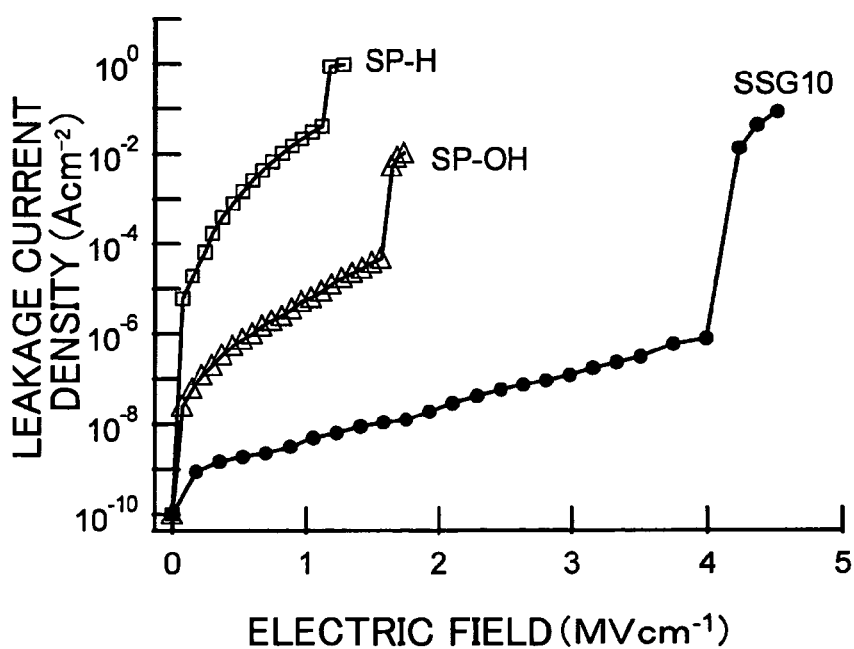
FIG. 14 is an explanatory view indicating the relationship between the leakage current density of various $HfO_2$ dielectric thin films and the electric field applied to the films.

FIG. 14 shows leakage current density-electric field curves of various HfO$_2$ dielectric thin films fabricated in Examples 9 and 10. In FIG. 14, the dark circle mark indicates SSG10, the triangle mark indicates SP—OH; and the square mark indicates SP—H. Table 12 shows the leakage current density of the samples in an electric field of 1 MV cm$^{-1}$.

TABLE 12

| Type of HfO$_2$ | Leakage Current Density/ A cm$^{-2}$ | Dielectric Breakdown Voltage/MV cm$^{-1}$ |
|---|---|---|
| SSG10 | $4.5 \times 10^{-9}$ | 4.0 |
| SP-OH | $5.6 \times 10^{-6}$ | 1.6 |
| SP-H | $2.5 \times 10^{-2}$ | 2.1 |

Comparing SP—OH with SP—H, it is understood that the leakage current of SP—OH is smaller by about $\frac{1}{10000}$ than that of SP—H in an electric field of 1 MV cm$^{-1}$. This may be because of the following reasons. As so mentioned in Example 1, in SP—H, a uniform SiO$_2$ layer is not formed on the surface of its Si substrate since the Si substrate is not hydrophilicated with H$_2$O$_2$ before the formation of the HfO$_2$ thin film thereon, and as a result, the leakage current of SP—H may be large.

The leakage current of SSG10 was smaller by $\frac{1}{1000}$ than that of SP—OH in an electric field of 1 MV cm$^{-1}$, and it is on an order of $10^{-9}$.

It is generally known that the leakage current of a dielectric thin film occurs principally in the grain boundary in the film (*Appl. Surf. Sci.*, 157, 387 (2000)). Accordingly, as so mentioned in Examples 9 and 10, since SSG10 has a continuous film texture and has much less grain boundary than in SP—OH, its leakage current could be effectively reduced.

There are some reports of a leakage current density of an HfO$_2$ ultra-thin film, which has a thickness of from 4 to 10 nm and which is formed in a mode of vapor-phase deposition, in an electric field of 1 MV cm$^{-1}$ The data are $1.0 \times 10^{-10}$ Acm$^{-1}$ (*J. Appl. Phys.*, 93, 712 (2003)); $4.0 \times 10^{-8}$ Acm$^{-1}$ (*Microelectron. Eng.*, 69, 145 (2003)); $1.2 \times 10^{-6}$ Acm$^{-1}$ (*Appl. Phys. Lett.*, 81, 2041 (2002)); $1.5 \times 10^{-4}$ Acm$^{-1}$ (*J. Appl. Phys.*, 90, 6466 (2001)). As compared with the data obtained in a vapor-phase deposition process, it is understood that the SSG10 has a small leakage current which is nearly equivalent to that of the film obtained in a vapor-phase deposition process.

From FIG. 14, in addition, it is understood that the HfO$_2$ thin films underwent dielectric breakdown. Table 13 shows the leakage current density and the dielectric breakdown voltage of the HfO$_2$ dielectric thin films in an electric field of 1 MV cm$^{-1}$.

TABLE 13

| Type of HfO$_2$ | Leakage Current Density/ A cm$^{-2}$ | Dielectric Breakdown Voltage/MV cm$^{-1}$ |
|---|---|---|
| SSG10 | $4.5 \times 10^{-9}$ | 4.0 |
| SP-OH | $5.6 \times 10^{-6}$ | 1.6 |
| SP-H | $2.5 \times 10^{-2}$ | 2.1 |

The dielectric breakdown voltage of the HfO$_2$ thin films increased in an order of SSG10>SP—OH>SP—H. In general, it is known that the dielectric breakdown of oxide dielectric ultra-thin films is caused by the alignment of voids in the thin films (*Jpn. J. Appl. Phys.*, Part 1, 41, 5957 (2002)). As is understood from the data in FIG. 10 and FIG. 12, SSG10 is a thin film that has neither void nor brain boundary and is dense on an atomic level, but SP—OH contains many voids and grain boundaries; and the difference in the thin film morphology between the two would result in the difference in the dielectric breakdown therebetween.

As in Examples 9 to 13, the invention has made it possible to produce nanometer-level dense and uniform amorphous HfO$_2$ dielectric thin films under a mild condition and in a simple manner. These ultra-thin films (SSG10) have an extremely excellent insulating property, and though having a thickness of tens nanometers, they well function as dielectric insulating film materials.

INDUSTRIAL APPLICABILITY

The production method of the invention is for producing a metal oxide thin film or an organic compound thin film according to an extremely simple manner of adsorption of a metal compound or an organic compound by a substrate (or contact of the two) within a short period of time. Therefore it does not require any specific equipment, and it is expected to attain high producibility.

In addition, since the production method of the invention is based on saturated adsorption on a solid surface, it can produce a sufficiently accurate metal oxide thin film even though the concentration of the metal compound and the temperature and the time for washing and hydrolysis are not severely defined. Further, according to the production method of the invention, the composition and the laminate structure of the metal oxide thin film to be formed can be designed, and therefore the method is usable in producing various types of dielectric thin films.

Specifically, the production method of the invention is expected to be applicable to various fields, as an important basic technique for high-integration devices of the next generation, as a technique of fabricating gate insulating films in various field-effect transistors (e.g., MOSFET, SWNT-TFT), as a technique of capacitor integration for logic circuits, and as a technique of producing thin film materials having new opto-electronic characteristics.

It is known that nano-laminate thin films fabricated by alternately laminating ultra-thin films of two or more different types of transition metal oxides, like the dielectric insulating material of the invention, have a higher insulating property and a higher dielectric constant than those of single-layered metal oxide thin films (typical reference, K. Kukli, et al., *J. Appl. Phys.*, 68, 3737, 1996). These materials are expected to be extremely effective material in the field of next-generation electronics and optoelectronics. The invention provides a production process for producing inexpensive and uniform metal oxide nano-laminate dielectrics using an extremely simple apparatus and using various metal compounds, and provides the metal oxide nano-laminate dielectrics produced according to the process and having an excellent insulating property and a high dielectric constant.

The invention claim is:

1. A method for producing a dielectric insulating thin film, comprising:
    a step (A) of making a substrate having a hydroxyl group in its surface or having a hydroxyl group introduced into its surface, adsorb a metal compound having a functional group capable of reacting with a hydroxyl group for condensation and capable of forming a hydroxyl group through hydrolysis,
    a step (B) of removing the excessive metal compound from the substrate surface,
    a step (C) of hydrolyzing the metal compound to thereby form a metal oxide layer having a hydroxyl group in the surface thereof,
    a step (D) of treating the above-mentioned layer according to any one treating method selected from the group consisting of oxygen plasma treatment, ozone oxidation treatment, firing treatment and rapid thermal annealing treatment to thereby obtain a dielectric insulating thin film; and
which further comprises, between the step (C) and the step (D), a step (G) of making the hydroxyl group in the surface of the metal oxide layer formed in the step (C) adsorb a rare earth metal ion, and a step (H) of removing the excessive rare earth metal ion from the surface of the metal oxide layer and hydroxylating the adsorbed rare earth metal ion to thereby form a rare earth metal layer.

2. The production method as claimed in claim 1, wherein the steps (A) to (C) as well as the steps (G) and (H) are repeated at least once between the step (C) and the step (D) to thereby form at least two layers of metal oxide layer and/or rare earth metal layer.

* * * * *